US012148780B2

(12) United States Patent
Park et al.

(10) Patent No.: US 12,148,780 B2
(45) Date of Patent: Nov. 19, 2024

(54) IMAGE SENSOR

(71) Applicant: SAMSUNG ELECTRONICS CO., LTD., Suwon-si (KR)

(72) Inventors: Haeyong Park, Yongin-si (KR); Sungsoo Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 387 days.

(21) Appl. No.: 17/735,605

(22) Filed: May 3, 2022

(65) Prior Publication Data

US 2023/0044820 A1 Feb. 9, 2023

(30) Foreign Application Priority Data

Aug. 5, 2021 (KR) ........................ 10-2021-0103290

(51) Int. Cl.
*H01L 27/146* (2006.01)
*H10K 39/32* (2023.01)

(52) U.S. Cl.
CPC .... *H01L 27/1463* (2013.01); *H01L 27/14614* (2013.01); *H01L 27/14641* (2013.01); *H01L 27/14621* (2013.01); *H01L 27/14645* (2013.01); *H10K 39/32* (2023.02)

(58) Field of Classification Search
None
See application file for complete search history.

(56) References Cited

U.S. PATENT DOCUMENTS

| 9,034,682 | B2 | 5/2015 | Shim et al. |
| 9,609,250 | B2 | 3/2017 | Lee et al. |
| 10,128,288 | B2 | 11/2018 | Oh et al. |
| 10,664,072 | B2 | 5/2020 | Lee et al. |
| 2016/0043119 | A1 | 2/2016 | Lee et al. |
| 2020/0075644 | A1 | 3/2020 | Aoki et al. |
| 2020/0219925 | A1* | 7/2020 | Jang .................. H01L 27/14627 |
| 2020/0235149 | A1 | 7/2020 | Shiraishi et al. |
| 2020/0266221 | A1 | 8/2020 | Uchida et al. |
| 2021/0074745 | A1 | 3/2021 | Mi et al. |
| 2021/0082974 | A1 | 3/2021 | Uchida et al. |
| 2021/0143191 | A1* | 5/2021 | Ha ...................... H01L 27/1463 |

FOREIGN PATENT DOCUMENTS

KR 10-2016-0016325 2/2016

\* cited by examiner

*Primary Examiner* — Anthony Ho
(74) *Attorney, Agent, or Firm* — F. Chau & Associates, LLC

(57) ABSTRACT

An image sensor includes a substrate having a plurality of pixel regions and a deep device isolation pattern disposed in the substrate between the pixel regions. The pixel regions include first, second, third, and fourth pixel regions, which are adjacent to each other in first and second directions. The deep device isolation pattern includes first portions interposed between the first and second pixel regions and between the third and fourth pixel regions and spaced apart from each other in the second direction, and second portions interposed between the first and third pixel regions and between the second and fourth pixel regions and spaced apart from each other in the first direction. The first pixel region includes a first extended active pattern, which is extended to the second pixel region in the first direction and is disposed between the first portions of the deep device isolation pattern.

20 Claims, 31 Drawing Sheets

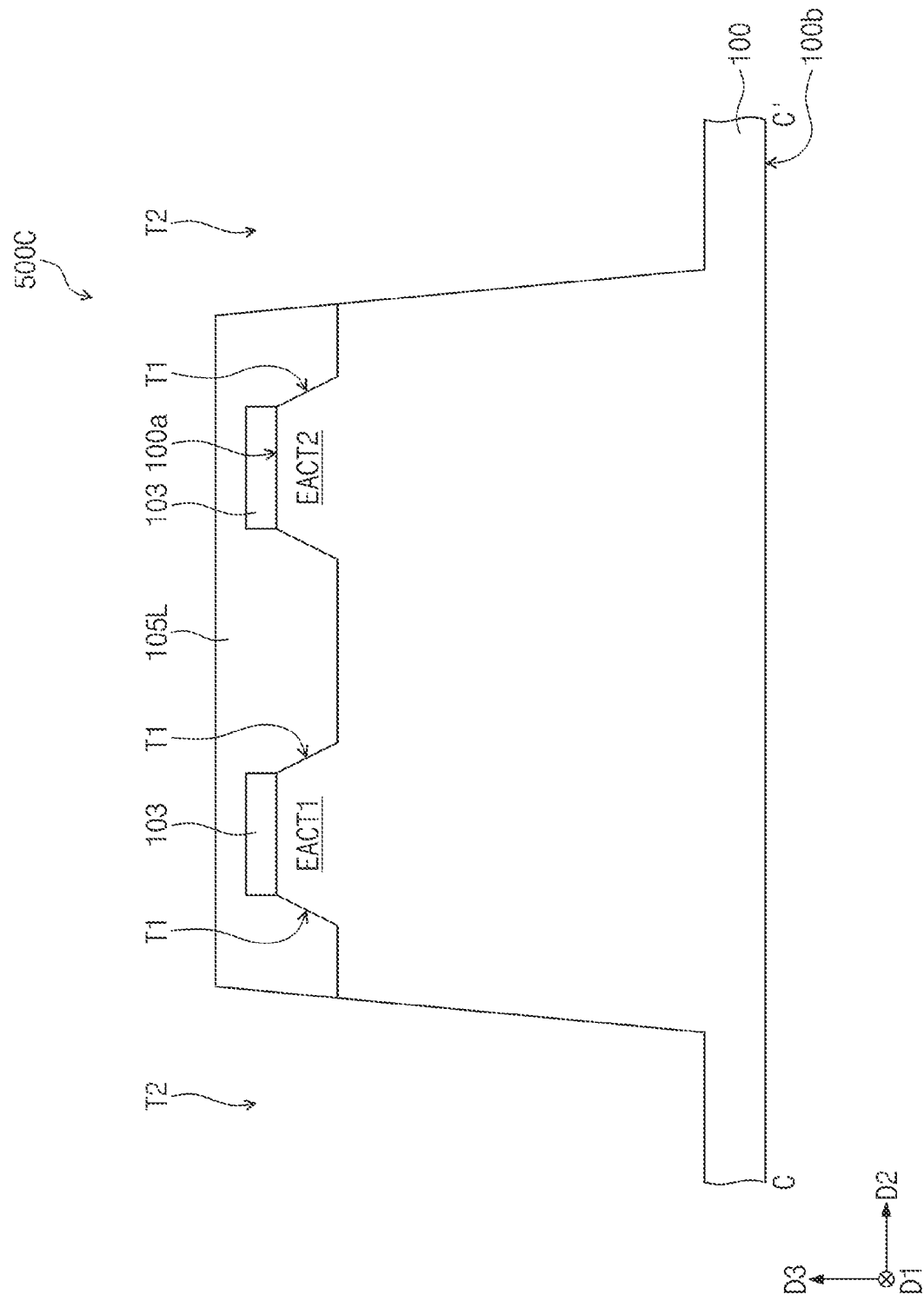

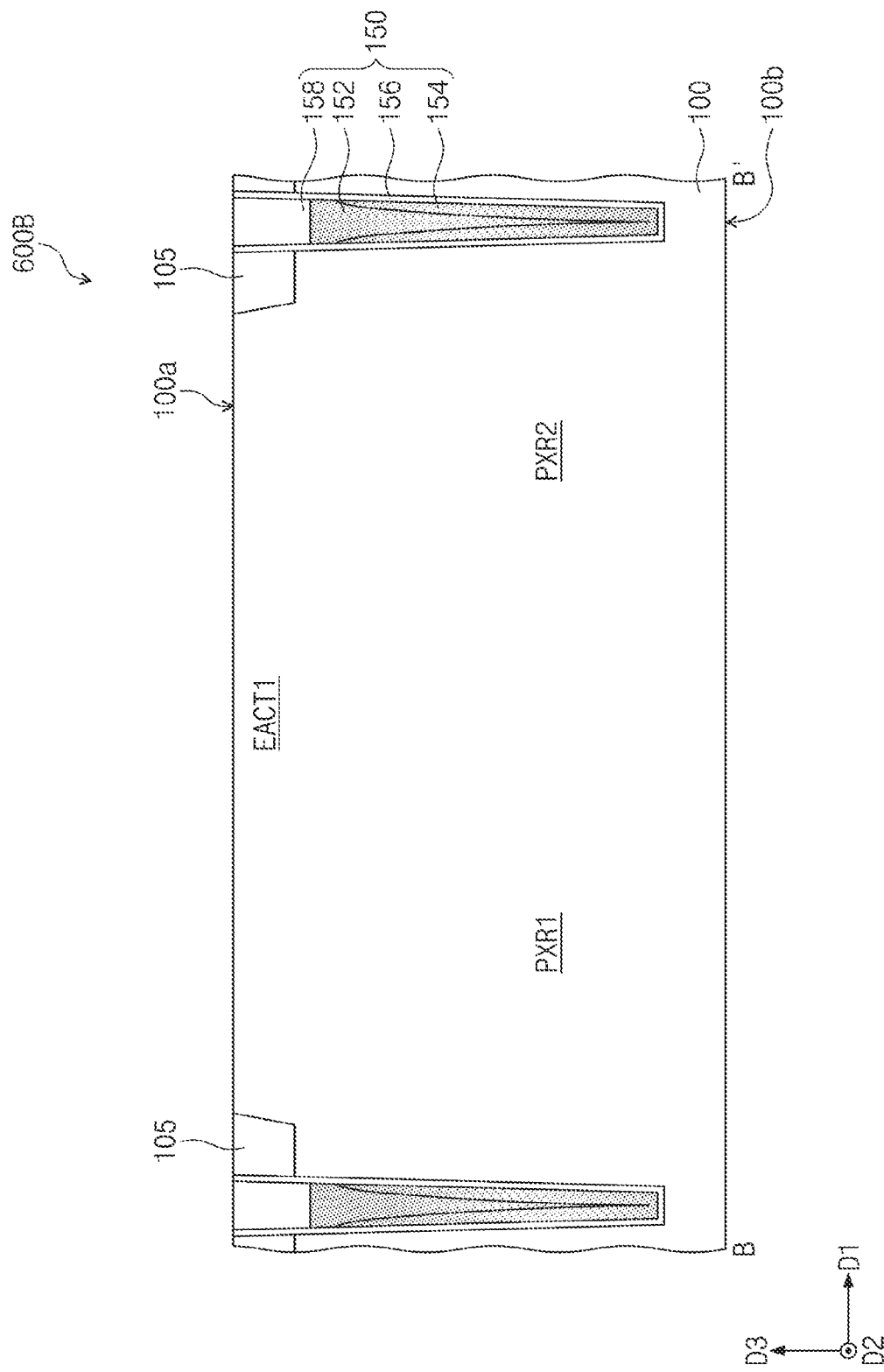

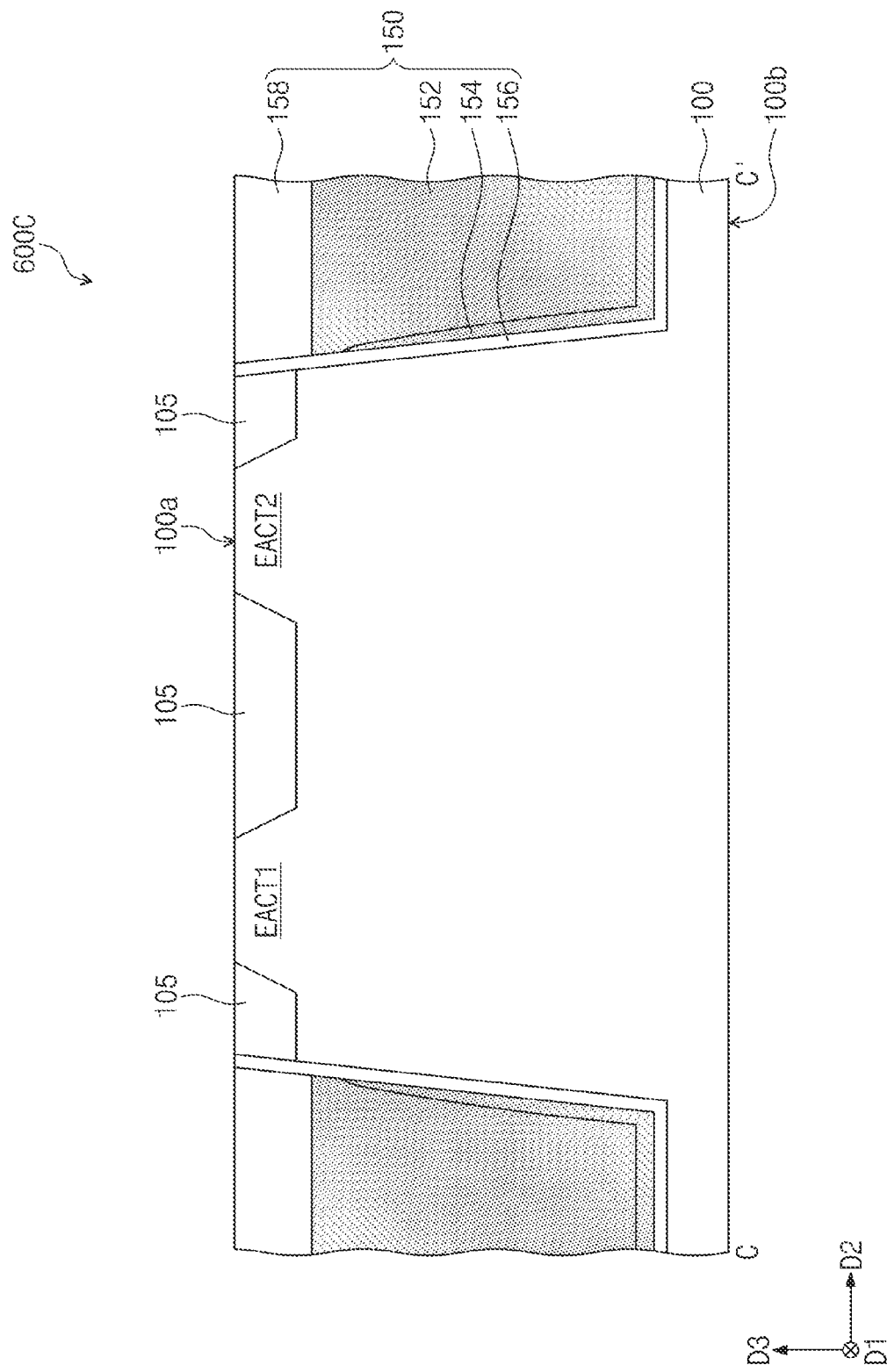

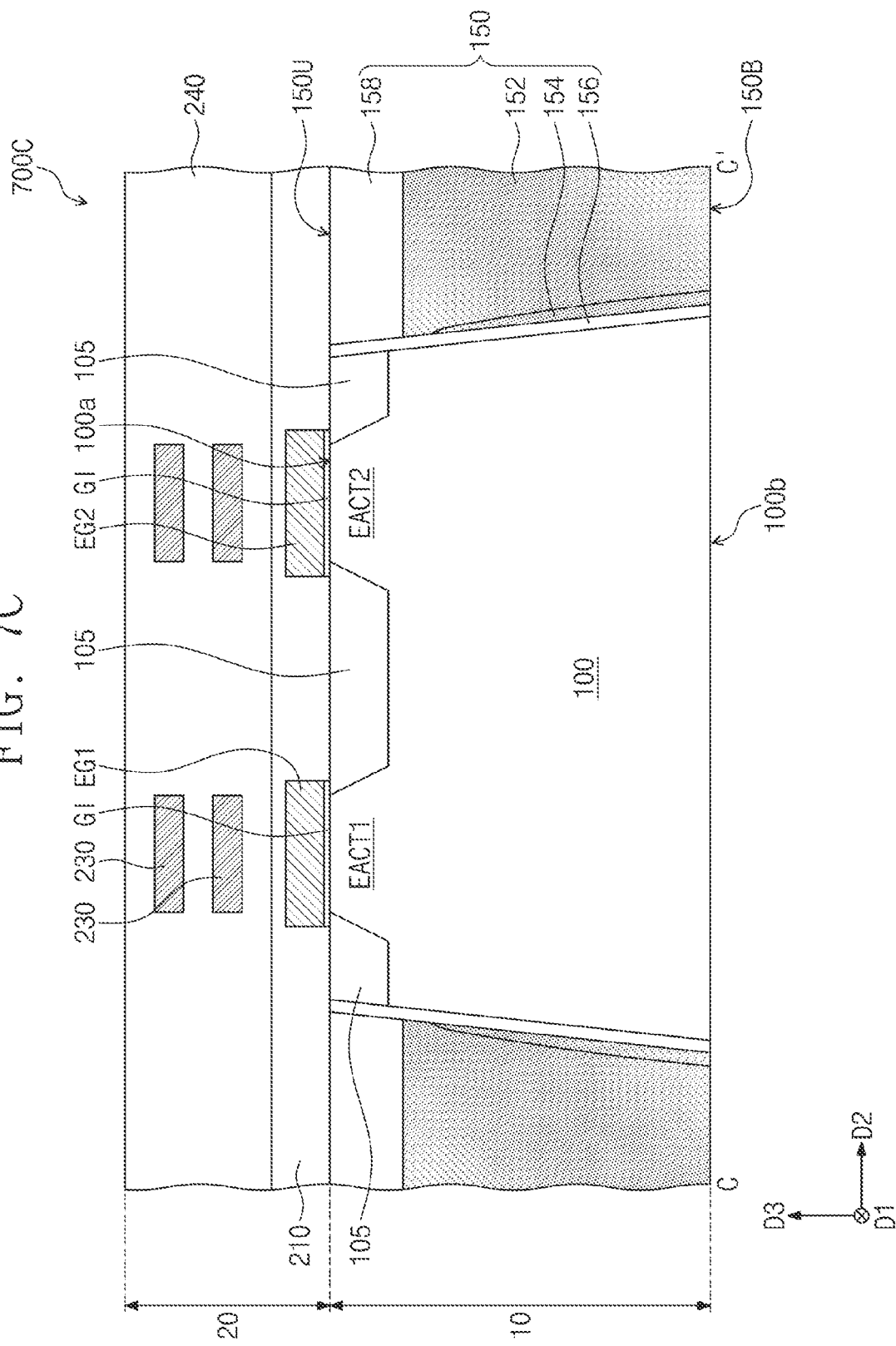

IMAGE SENSOR

CROSS-REFERENCE

This U.S. non-provisional patent application claims priority under 35 U.S.C. § 119 to Korean Patent Application No. 10-2021-0103290, filed on Aug. 5, 2021, in the Korean Intellectual Property Office, the entire contents of which are hereby incorporated by reference.

FIELD

The present disclosure relates to an image sensor, and in particular, to a complementary metal-oxide-semiconductor (CMOS) image sensor.

DISCUSSION

An image sensor may be a semiconductor device converting an optical image into electric signals. With recent developments in the computer and communications industries, there is an increasing demand for high-performance image sensors in a variety of applications such as digital cameras, camcorders, personal communications systems, gaming machines, security cameras, micro-cameras for medical applications, robots, and the like. Such image sensors may be classified into various types, including at least a charge coupled device (CCD) type and a complementary metal-oxide-semiconductor (CMOS) type. In general, the CMOS-type image sensor (CIS) device may include a plurality of two-dimensionally-arranged pixels. Each of the pixels may include a photodiode (PD) that converts incident light into an electrical signal. The pixels may be defined by a deep isolation pattern disposed therebetween.

SUMMARY

An embodiment of the present disclosure provides an image sensor configured to minimize cross-talk between pixels and to increase a size of a gate electrode, and a method of fabricating the same.

An embodiment of the present disclosure provides an image sensor having an integration density that can be increased, and a method of fabricating the same.

According to an embodiment of the present disclosure, an image sensor may include a substrate including a plurality of pixel regions and a deep device isolation pattern disposed in the substrate between the pixel regions. The pixel regions may include a first pixel region and a second pixel region, which are adjacent to each other in a first direction parallel to a first surface of the substrate, a third pixel region, which is adjacent to the first pixel region in a second direction that is parallel to the first surface of the substrate and crosses the first direction, and a fourth pixel region, which is adjacent to the second pixel region in the second direction and is adjacent to the third pixel region in the first direction. The deep device isolation pattern may include first portions, which are interposed between the first and second pixel regions and between the third and fourth pixel regions and are spaced apart from each other in the second direction, and second portions, which are interposed between the first and third pixel regions and between the second and fourth pixel regions and are spaced apart from each other in the first direction. The first pixel region may include a first extended active pattern. The first extended active pattern may be extended to the second pixel region in the first direction and may be disposed between the first portions of the deep device isolation pattern.

According to an embodiment of the present disclosure, an image sensor may include a substrate having a first surface and a second surface, which are disposed opposite to each other, and a deep device isolation pattern penetrating the substrate. The deep device isolation pattern may have a top surface, which is exposed to an outside of the substrate near the first surface of the substrate, and a bottom surface, which is exposed to an outside of the substrate near the second surface of the substrate. The substrate may include a first pixel region and a second pixel region, which are adjacent to each other in a first direction parallel to the first surface, a third pixel region, which is adjacent to the first pixel region in a second direction that is parallel to the first surface and crosses the first direction, and a fourth pixel region, which is adjacent to the second pixel region in the second direction and is adjacent to the third pixel region in the first direction. The deep device isolation pattern may include first portions, which are interposed between the first and second pixel regions and between the third and fourth pixel regions and are spaced apart from each other in the second direction, and second portions, which are interposed between the first and third pixel regions and between the second and fourth pixel regions and are spaced apart from each other in the first direction.

BRIEF DESCRIPTION OF THE DRAWINGS

FIGS. 5A to 7A are sectional view diagrams, which are taken along the line A-A' of FIG. 3 to illustrate a method of fabricating an image sensor according to an embodiment of the present disclosure.

FIGS. 5B to 7B are sectional view diagrams, which are taken along the line B-B' of FIG. 3 to illustrate a method of fabricating an image sensor according to an embodiment of the present disclosure.

FIGS. 5C to 7C are sectional view diagrams, which are taken along the line C-C' of FIG. 3 to illustrate a method of fabricating an image sensor according to an embodiment of the present disclosure.

DETAILED DESCRIPTION

Illustrative embodiments of the present disclosure will now be described more fully with reference to the accompanying drawings, in which like reference indica may be used to indicate like features, without limitation thereto.

Figure 1:
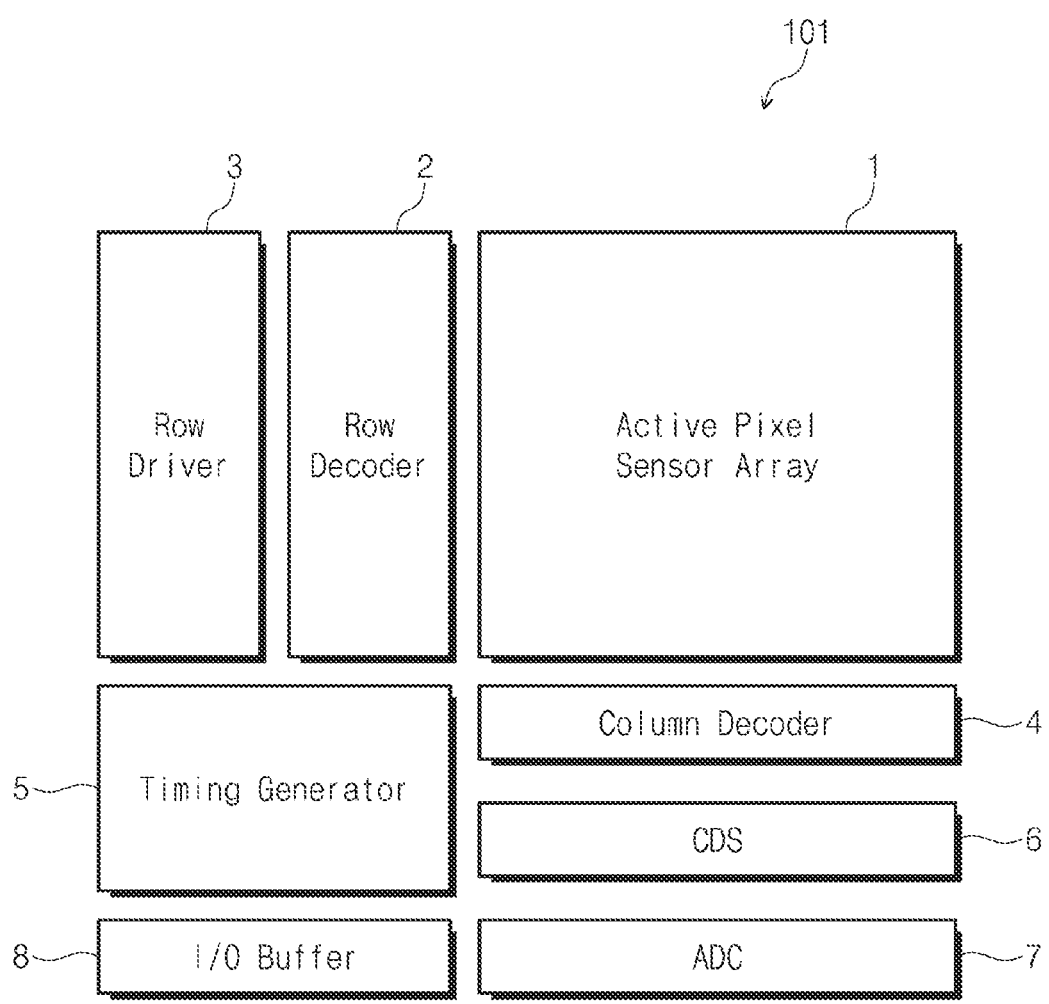
FIG. 1 is a block diagram schematically illustrating an image sensor according to an embodiment of the present disclosure.

FIG. 1 illustrates an image sensor according to an embodiment of the present disclosure.

Referring to FIG. 1, an image sensor 101 may include an active pixel sensor array 1, a row decoder 2, a row driver 3, a column decoder 4, a timing generator 5, a correlated double sampler (CDS) 6, an analog-to-digital converter (ADC) 7, and an input/output (I/O) buffer 8.

The active pixel sensor array 1 may include a plurality of pixels, which are two-dimensionally arranged and are used to convert optical signals to electrical signals. The active pixel sensor array 1 may be driven by a plurality of driving signals (e.g., pixel selection signals, reset signals, and charge transfer signals) provided from the row driver 3. In addition, the electrical signals, which are converted by the active pixel sensor array 1, may be provided to the CDS 6.

The row driver 3 may provide a plurality of driving signals, which are used to drive the pixels, to the active pixel sensor array 1, based on results decoded by the row decoder 2. In the case where the pixels are arranged in a matrix shape, the driving signals may be applied to respective rows of the pixels The timing generator 5 may be configured to provide a timing signal and a control signal to the row decoder 2 and the column decoder 4.

The CDS 6 may be configured to receive the electric signals generated by the active pixel sensor array 1 and to perform a holding and sampling operation on the received electric signals. In addition, the CDS 6 may be configured to perform a double sampling operation using a specific noise level and a signal level of the electric signal and then to output a difference level corresponding to a difference between the noise and signal levels.

The ADC 7 may be configured to convert an analog signal, which contains information on the difference level outputted from the CDS 6, to a digital signal and to output the converted digital signal.

The I/O buffer 8 may be configured to latch the digital signals and then to sequentially output the latched digital signals to an image signal processing unit (not shown), based on the result decoded by the column decoder 4.

Figure 2:
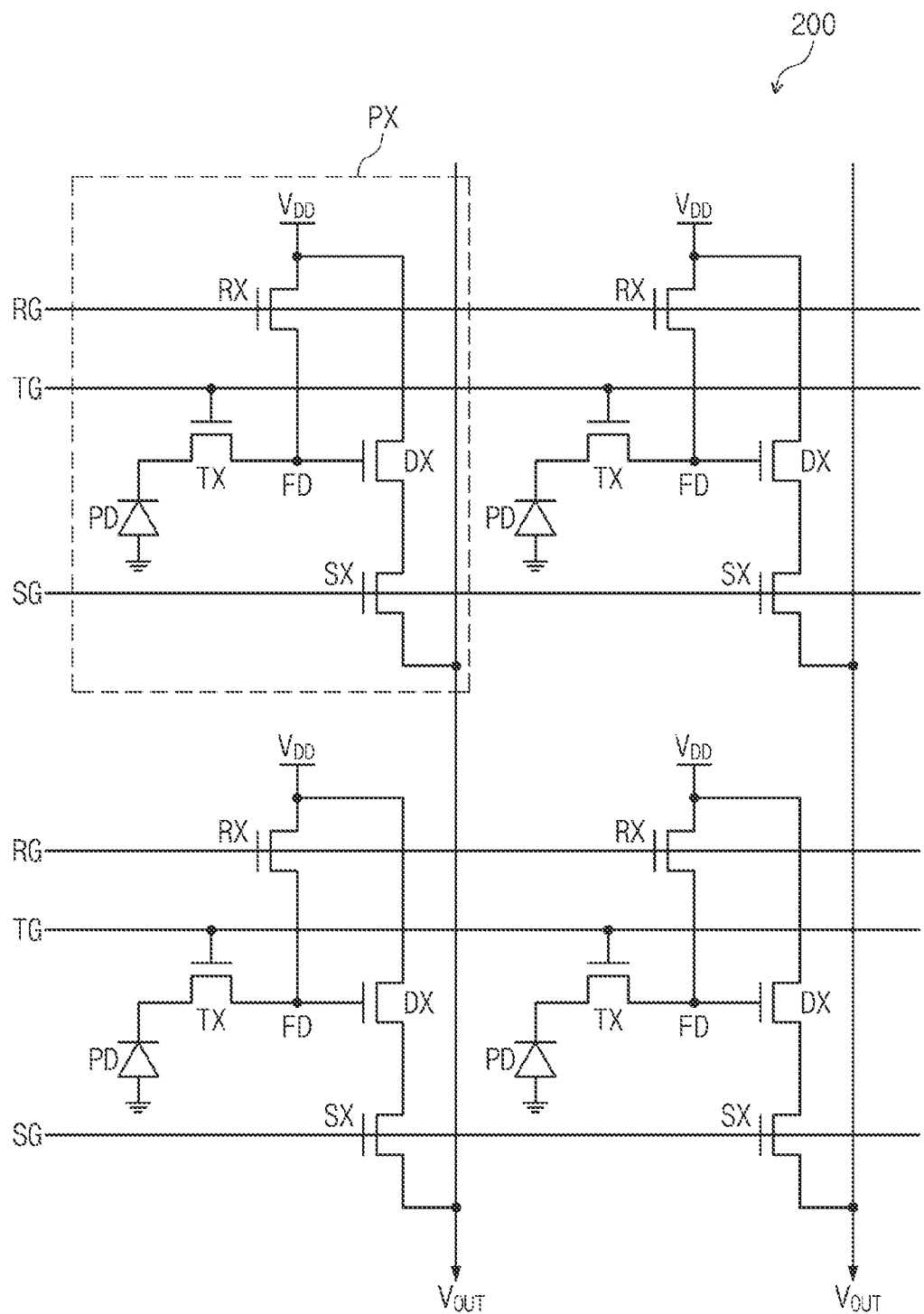
FIG. 2 is a circuit diagram illustrating an active pixel sensor array of an image sensor according to an embodiment of the present disclosure.

FIG. 2 illustrates an active pixel sensor array of an image sensor according to an embodiment of the present disclosure.

Referring to FIGS. 1 and 2, the active pixel sensor array 1 may include a portion 200 having a plurality of pixels PX, which are arranged in a matrix shape. Each of the pixels PX may include a transfer transistor TX and logic transistors RX, SX, and DX. The logic transistors may include a reset transistor RX, a selection transistor SX, and a driving transistor DX. The transfer transistor TX, the reset transistor RX, and the selection transistor SX may include a transfer gate TG, a reset gate RG, and a selection gate SG, respectively. Each of the pixels PX may further include a photoelectric conversion device PD and a floating diffusion region FD.

The photoelectric conversion device PD may be configured to generate and hold photocharges whose amount is in proportional to an amount of light incident from the outside. The photoelectric conversion device PD may be a photodiode including a p-type impurity region and an n-type impurity region. The transfer transistor TX may be configured to transfer electric charges, which are generated in the photoelectric conversion device PD, to the floating diffusion region FD. The floating diffusion region FD may be configured to receive the charges, which are generated in the photoelectric conversion device PD, and to cumulatively store the charges therein. The driving transistor DX may be controlled by an amount of the photocharges, which are stored in the floating diffusion region FD.

The reset transistor RX may be configured to periodically discharge the electric charges stored in the floating diffusion region FD. A drain electrode of the reset transistor RX may be connected to the floating diffusion region FD, and a source electrode of the reset transistor RX may be connected to a power voltage VDD. If the reset transistor RX is turned on, the power voltage VDD, which is connected to the source electrode of the reset transistor RX, may be applied to the floating diffusion region FD. Thus, the reset transistor RX may be turned on, and in this case, the electric charges stored in the floating diffusion region FD may be discharged; that is, the floating diffusion region FD may be reset.

The driving transistor DX may serve as a source follower buffer amplifier. The driving transistor DX may be configured to amplify a variation in electric potential of the floating diffusion region FD and to output the amplified signal to an output line Vout.

The selection transistor SX may be used to select a row of the pixels P to be read out during a read operation. If the selection transistor SX is turned on, the power voltage VDD may be applied to a drain electrode of the driving transistor DX.

FIG. 2 illustrates the unit pixel PX including one photoelectric conversion device PD and four transistors TX, RX, DX, and SX, but the present disclosure is not limited to this structure of the image sensor. For example, the reset transistor RX, the driving transistor DX, or the selection transistor SX may be shared by adjacent ones of the pixels PX. In this case, an integration density of the image sensor may be increased.

Figure 3:
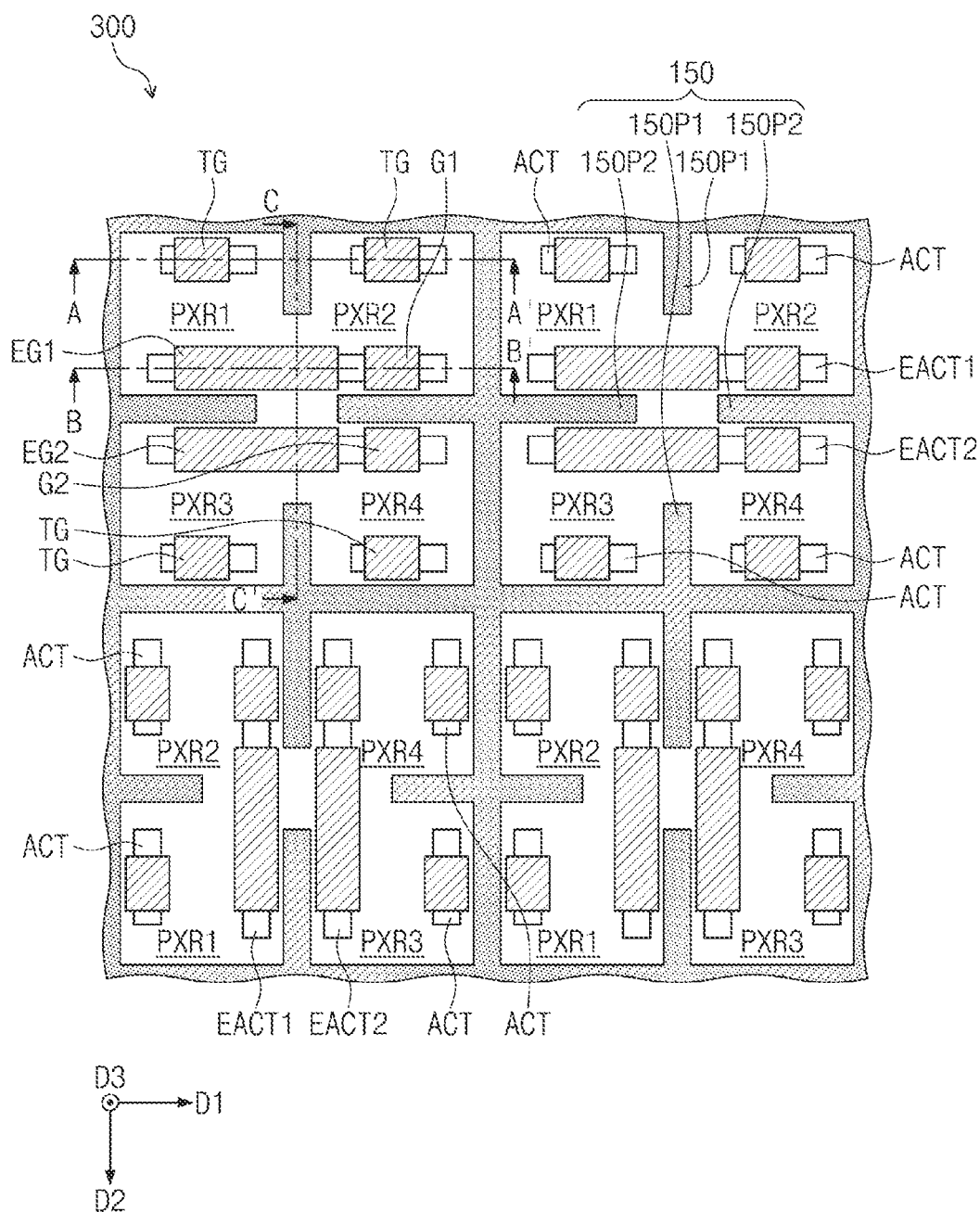
FIG. 3 is a plan view diagram illustrating an image sensor according to an embodiment of the present disclosure.
Figure 4A:
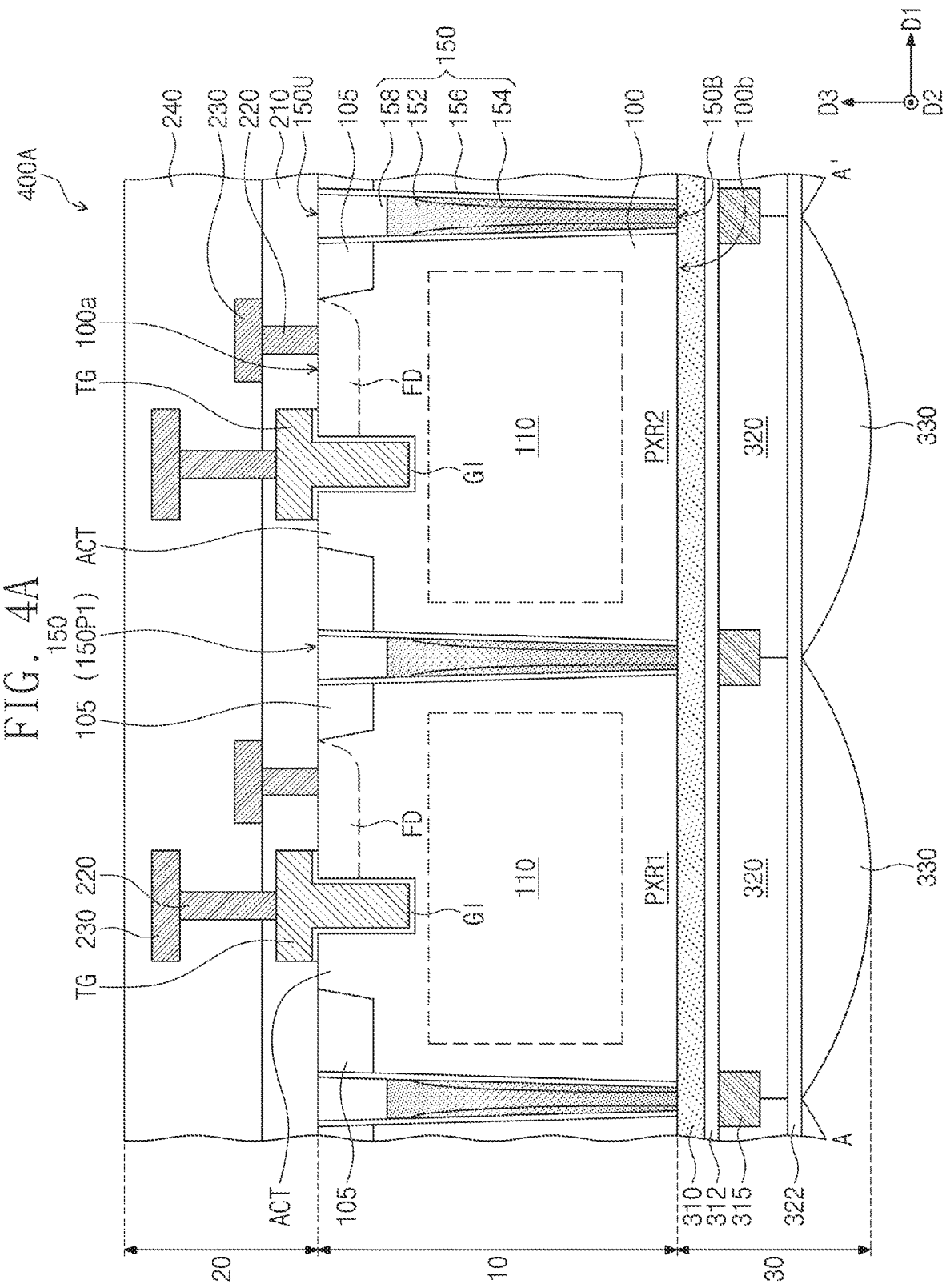
FIGS. 4A, 4B, and 4C are sectional view diagrams taken along lines A-A', B-B' and C-C', respectively, of FIG. 3.
Figure 4B:
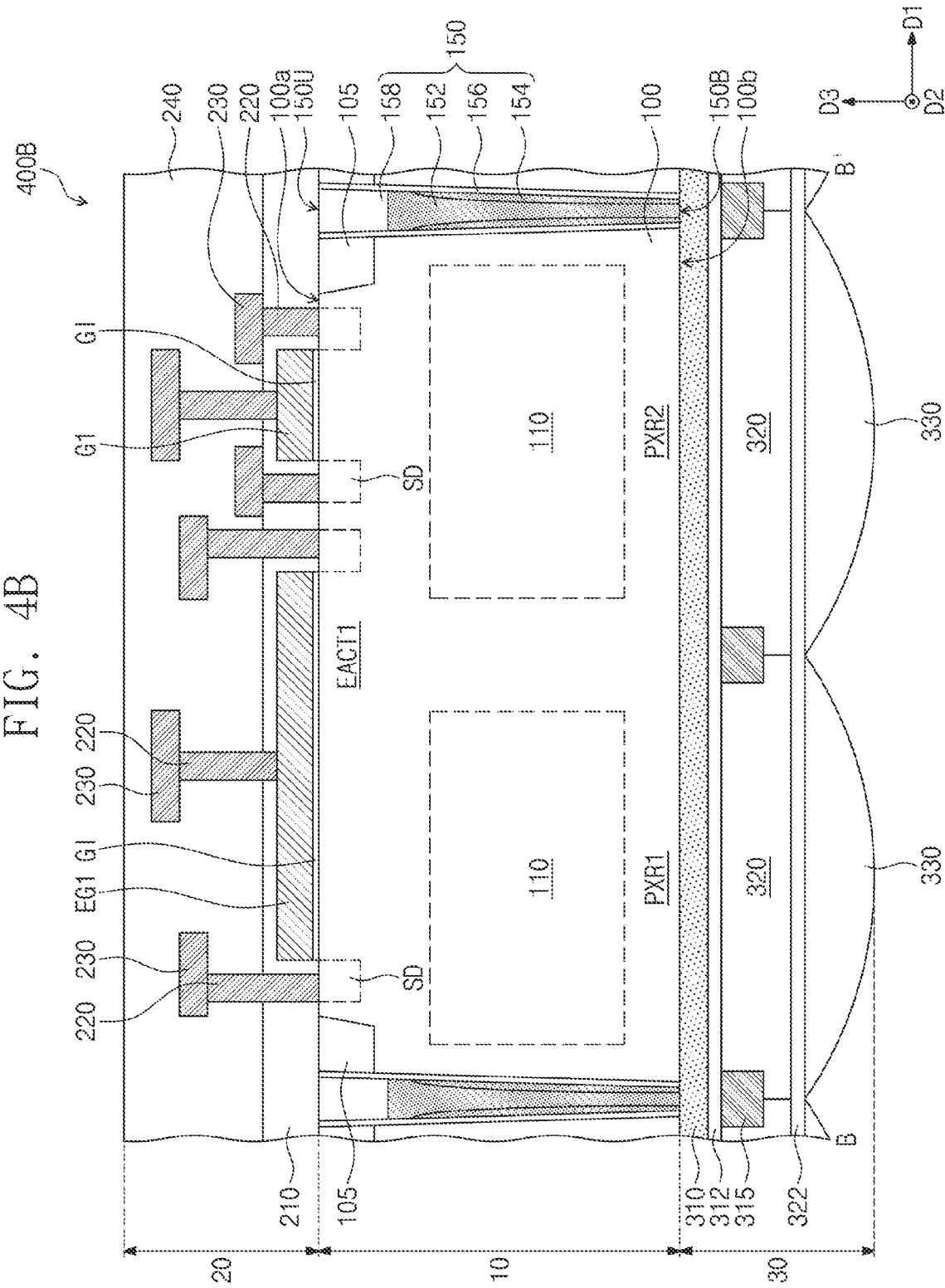
Figure 4C:
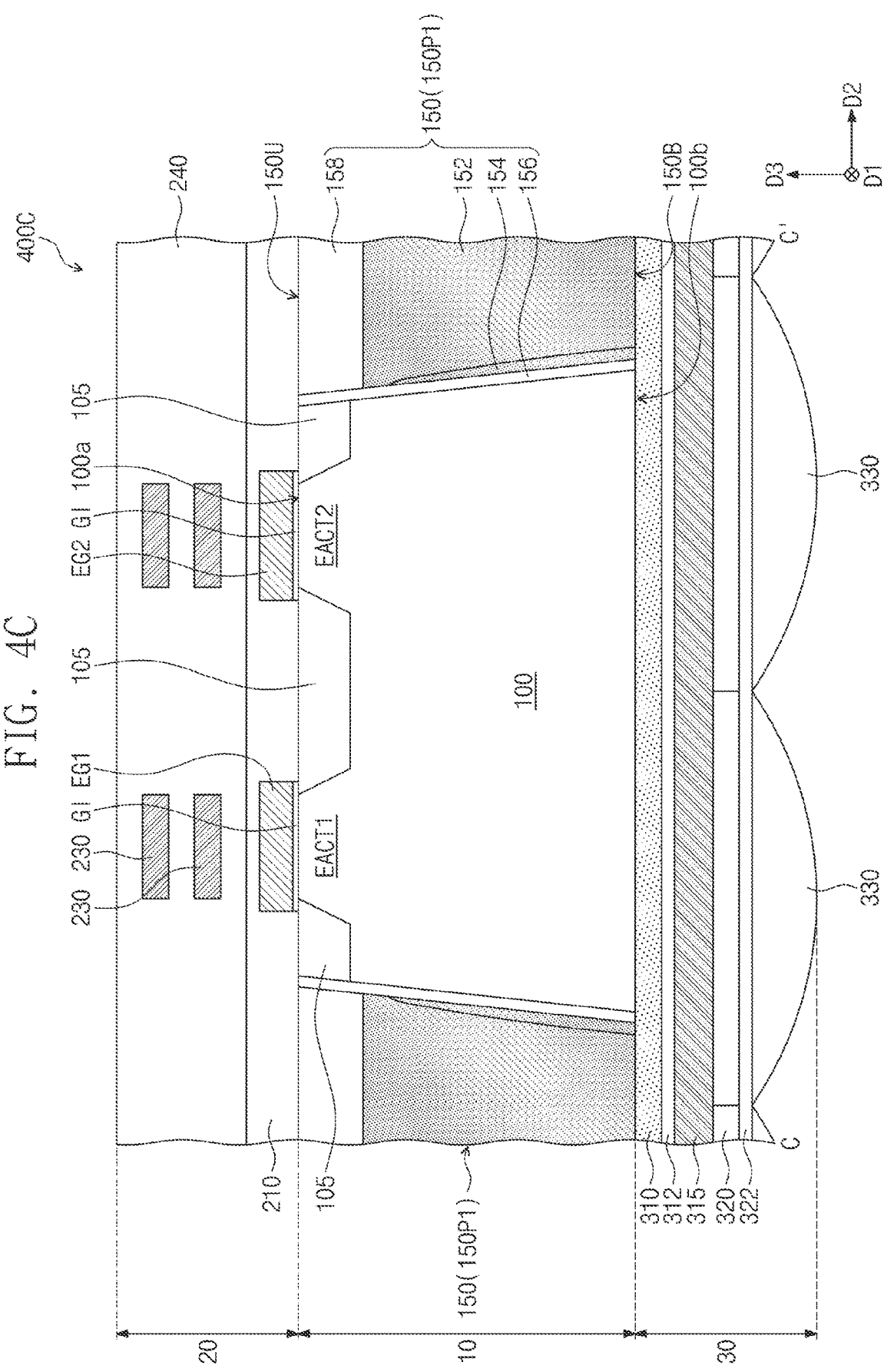
Figure 5A:
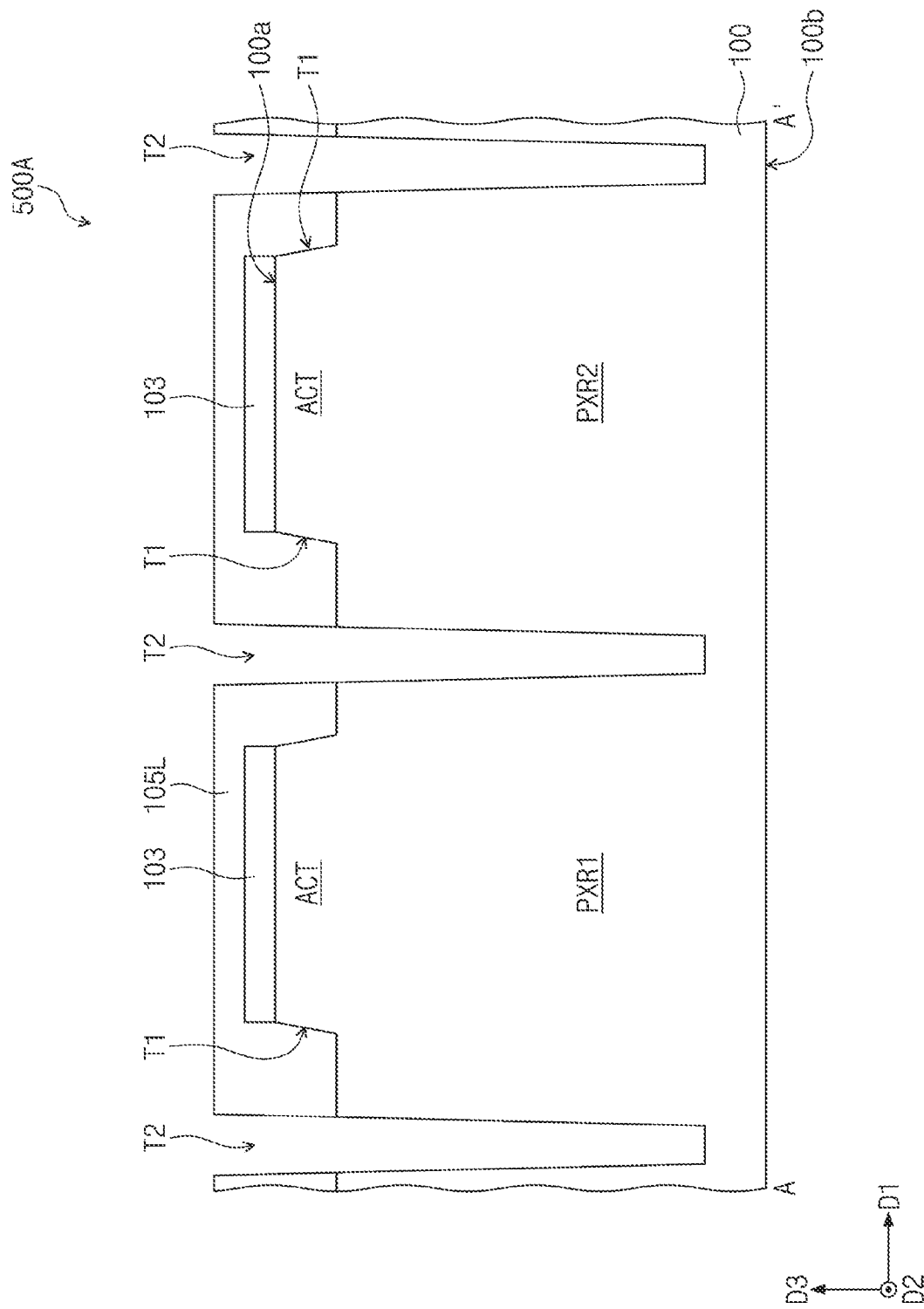
Figure 5B:
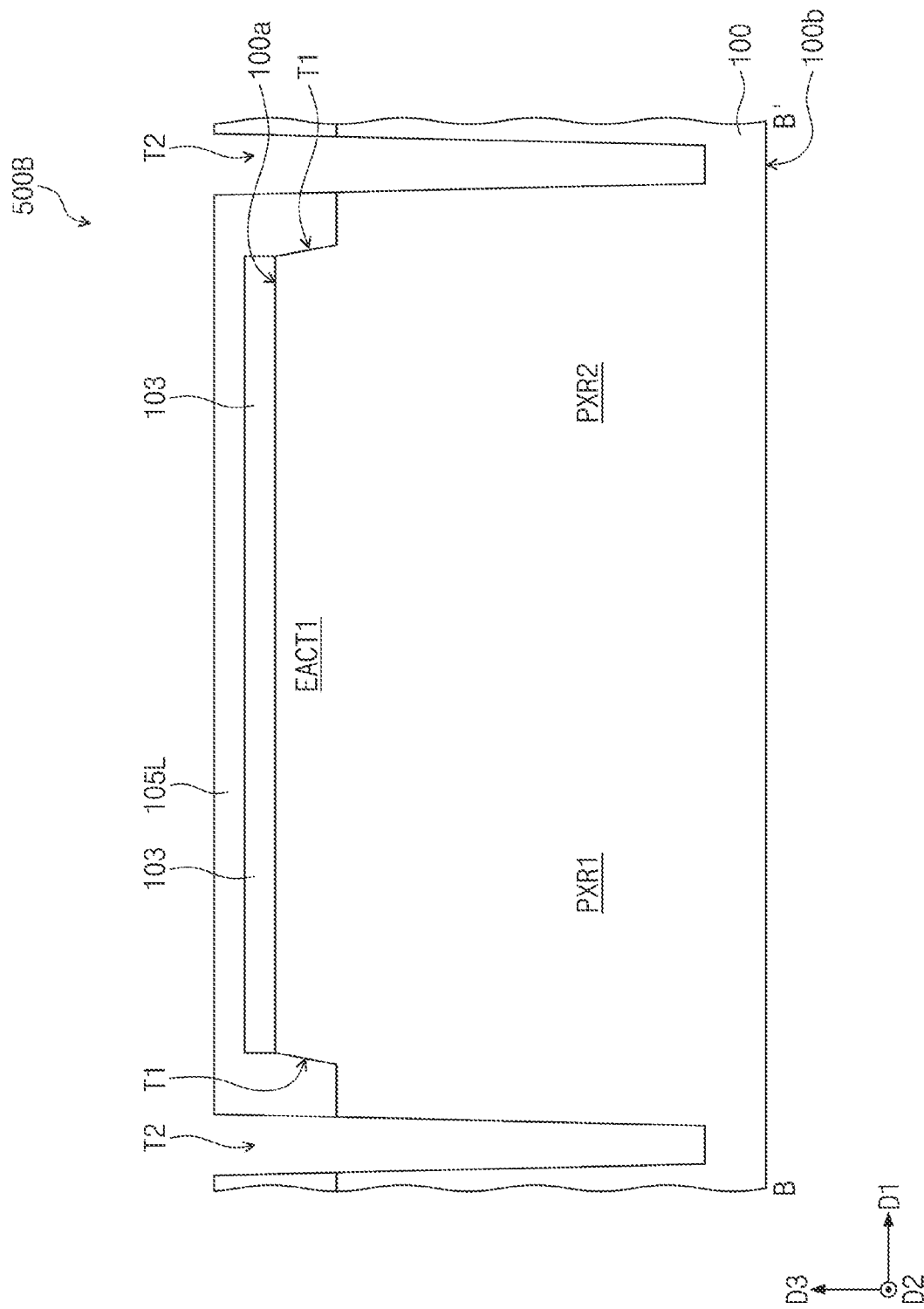
Figure 6A:
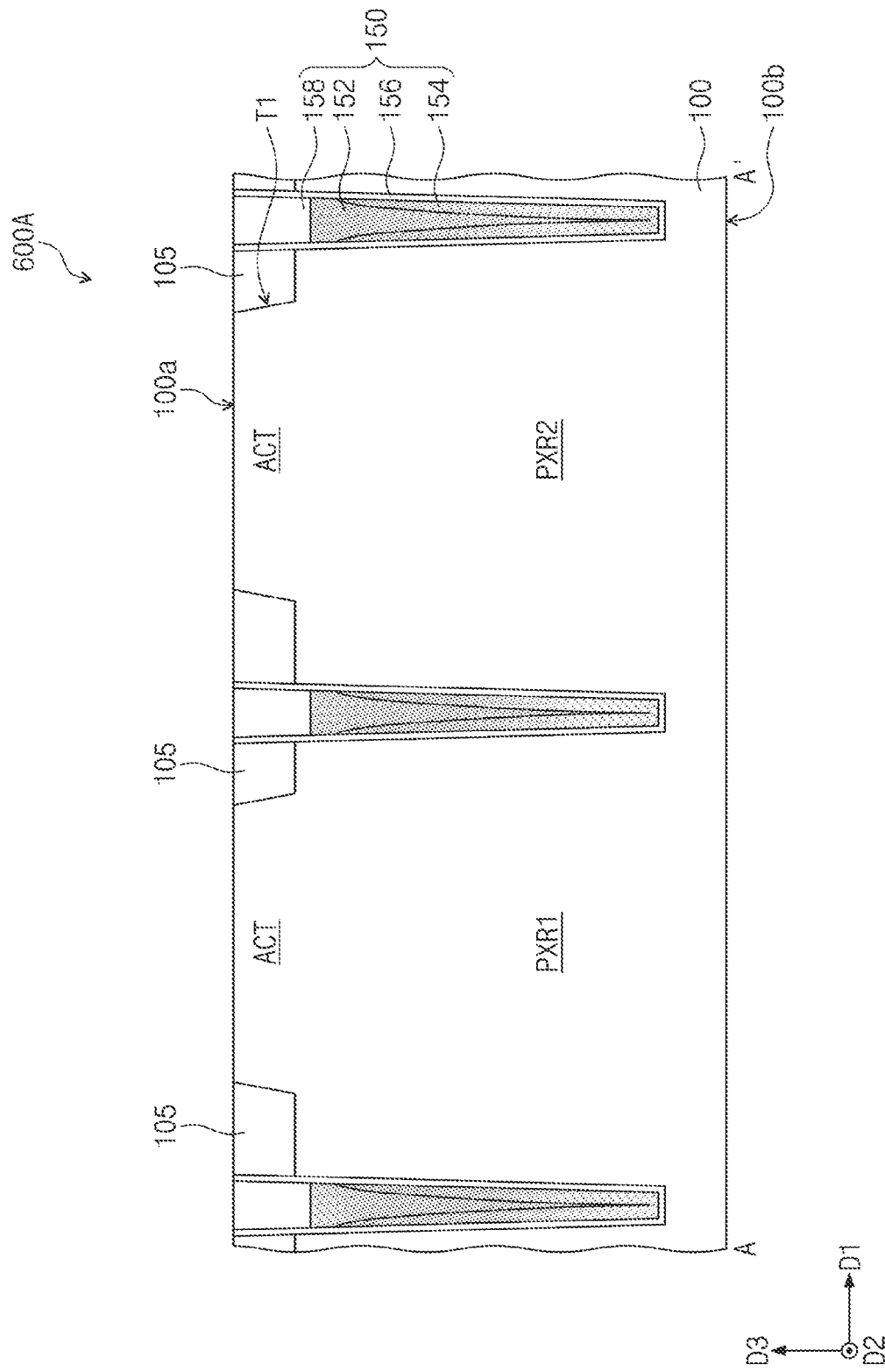
Figure 7A:
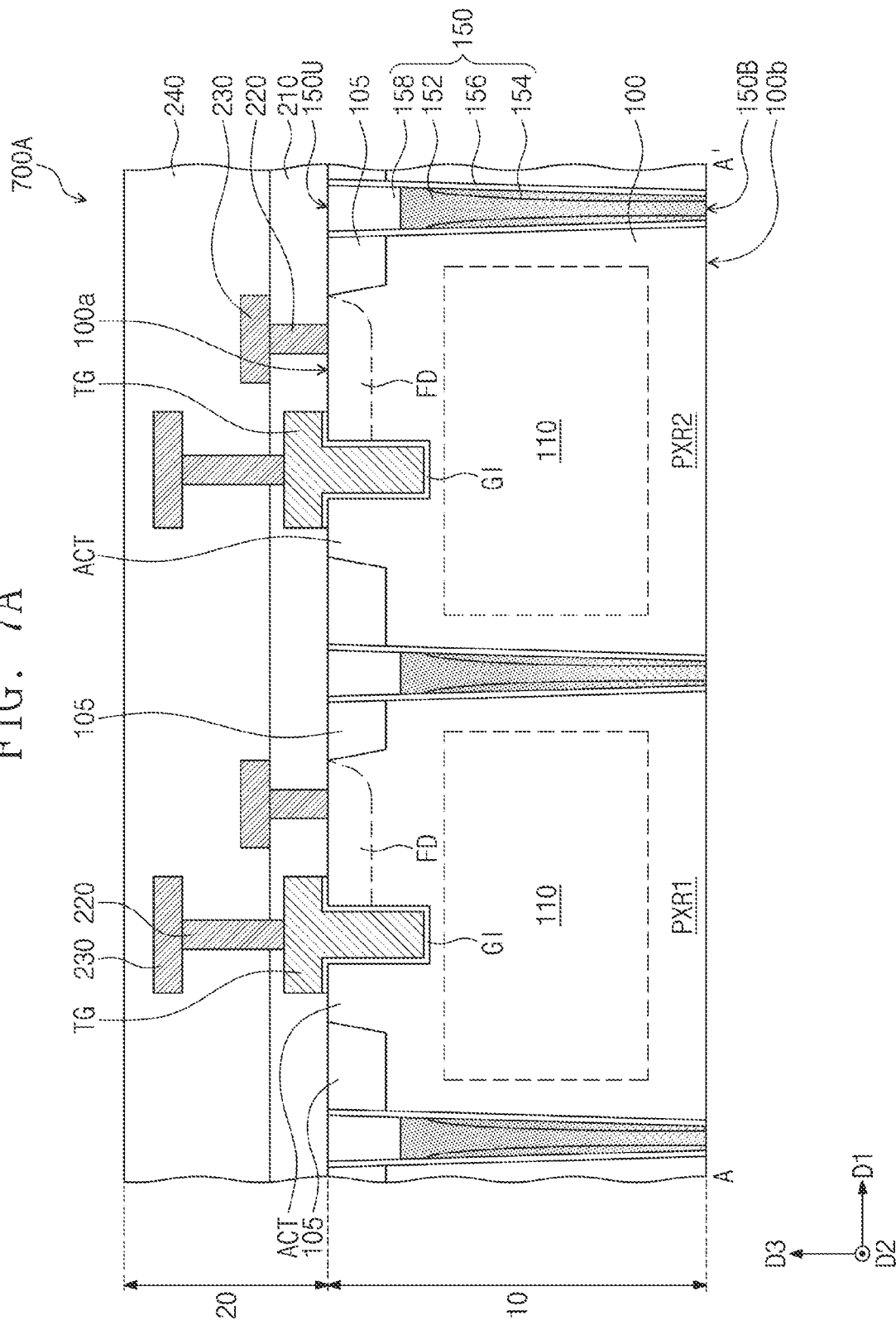
Figure 7B:
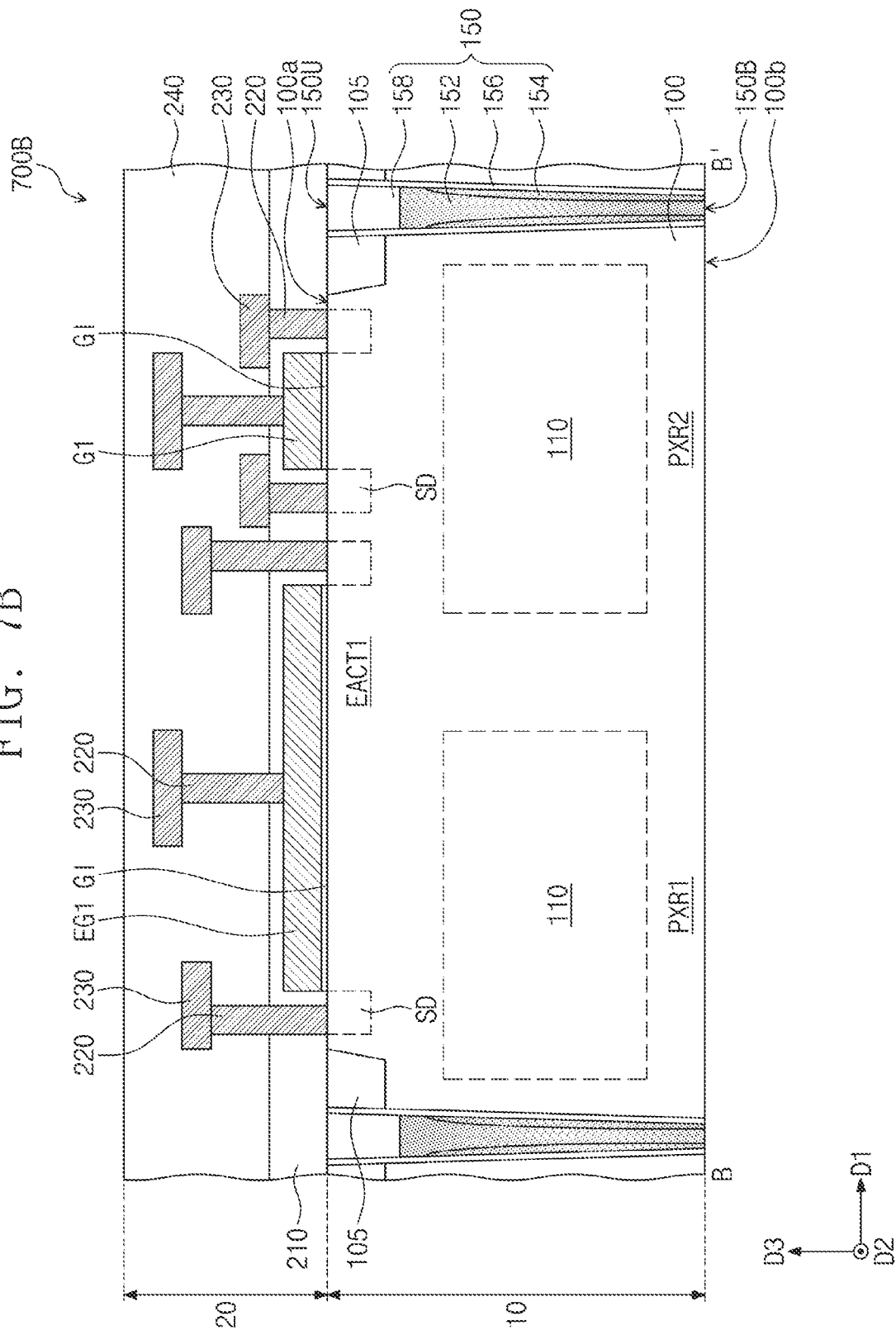

FIG. 3 illustrates an image sensor according to an embodiment of the present disclosure. FIGS. 4A, 4B, and 4C show sectional views taken along lines A-A', B-B' and C-C', respectively, of FIG. 3.

Referring to FIGS. 3 and 4A to 4C, an image sensor 300 may include a photoelectric conversion layer 10, an interconnection layer 20, and an optically-transparent layer 30, such as in sections 400A, 400B and 400C. The photoelectric conversion layer 10 may be disposed between the interconnection layer 20 and the optically-transparent layer 30.

The photoelectric conversion layer 10 may include a substrate 100, and the substrate 100 may include a plurality of pixel regions PXR1, PXR2, PXR3, and PXR4. The substrate 100 may be a semiconductor substrate (e.g., a silicon wafer, a germanium wafer, a silicon-germanium wafer, a II-VI compound semiconductor wafer, or a III-V compound semiconductor wafer) or a silicon-on-insulator (SOI) wafer. The substrate 100 may have a first surface 100a and a second surface 100b, which are disposed opposite to each other. The pixel regions PXR1, PXR2, PXR3, and PXR4 may be two-dimensionally arranged in a first direction D1 and a second direction D2, which are parallel to the first surface 100a of the substrate 100. The first and second directions D1 and D2 may cross or be non-parallel to each other.

The photoelectric conversion layer 10 may further include a deep device isolation pattern 150, which is provided to penetrate the substrate 100 and is disposed between the pixel regions PXR1, PXR2, PXR3, and PXR4. The deep device isolation pattern 150 may be provided to penetrate the substrate 100 in a third direction D3 perpendicular to the first surface 100a of the substrate 100. The deep device isolation pattern 150 may be extended from the first surface 100a of the substrate 100 toward the second surface 100b of the substrate 100. A top surface 150U of the deep device isolation pattern 150 may be exposed to an outside of the substrate 100 near the first surface 100a, and a bottom surface 150b of the deep device isolation pattern 150 may be exposed to an outside of the substrate 100 near the second surface 100b. In other words, the first surface 100a of the substrate 100 may expose the top surface 150U of the deep device isolation pattern 150, and the second surface 100b of the substrate 100 may expose the bottom surface 150b of the deep device isolation pattern 150. The top surface 150U of the deep device isolation pattern 150 may be substantially coplanar with the first surface 100a of the substrate 100, and the bottom surface 150b of the deep device isolation pattern 150 may be substantially coplanar with the second surface 100b of the substrate 100. The deep device isolation pattern 150 may prevent cross-talk from occurring between adjacent ones of the pixel regions PXR1, PXR2, PXR3, and PXR4.

The deep device isolation pattern 150 may include a semiconductor pattern 152 and 154 penetrating at least a portion of the substrate 100, a gap-fill insulating pattern 158 on the semiconductor pattern 152 and 154, and a sidewall insulating pattern 156 interposed between the semiconductor pattern 152 and 154 and the substrate 100. The sidewall insulating pattern 156 may be extended from a side surface of the semiconductor pattern 15 and 154 to a side surface of the gap-fill insulating pattern 158. The semiconductor pattern 152 and 154 may include a first semiconductor pattern 152, which is provided to penetrate at least a portion of the substrate 100, and a second semiconductor pattern 154, which is interposed between the first semiconductor pattern 152 and the sidewall insulating pattern 156. The first semiconductor pattern 152 may cover the topmost surface of the second semiconductor pattern 154 and may be in contact with the sidewall insulating pattern 156. The gap-fill insulating pattern 158 may be disposed on the first semiconductor pattern 152. The first semiconductor pattern 152 may be extended into a region between the gap-fill insulating pattern 158 and the second semiconductor pattern 154 and may be in contact with the sidewall insulating pattern 156.

Each of the first and second semiconductor patterns 152 and 154 may be formed of or include a doped semiconductor material. In an embodiment, each of the first and second semiconductor patterns 152 and 154 may be formed of or include a semiconductor material of a p- or n-type. As an example, each of the first and second semiconductor patterns 152 and 154 may be formed of or include boron-doped poly silicon. Each of the sidewall and gap-fill insulating patterns 156 and 158 may be formed of or include at least one of, for example, silicon oxide, silicon nitride, and/or silicon oxynitride.

The pixel regions PXR1, PXR2, PXR3, and PXR4 may include a first pixel region PXR1, a second pixel region PXR2, a third pixel region PXR3, and a fourth pixel region PXR4, which are adjacent to each other in the first and second directions D1 and D2. As an example, the first pixel region PXR1 may be adjacent to the second pixel region PXR2 in the first direction D1, and the third pixel region PXR3 may be adjacent to the first pixel region PXR1 in the second direction D2. The fourth pixel region PXR4 may be adjacent to the second pixel region PXR2 in the second direction D2 and may be adjacent to the third pixel region PXR3 in the first direction D1. However, the present disclosure is not limited to the afore-described arrangement of the first to fourth pixel regions PXR1, PXR2, PXR3, and PXR4. For example, the first pixel region PXR1 may be adjacent to the second pixel region PXR2 in the second direction D2, and the third pixel region PXR3 may be adjacent to the first pixel region PXR1 in the first direction D1. The fourth pixel region PXR4 may be adjacent to the second pixel region PXR2 in the first direction D1 and may be adjacent to the third pixel region PXR3 in the second direction D2. For the sake of simplicity, the description that follows will refer to an example in which the first to fourth pixel regions PXR1, PXR2, PXR3, and PXR4 are arranged such that the first and second pixel regions PXR1 and PXR2 are adjacent to each other in the first direction D1.

The deep device isolation pattern 150 may be provided to enclose the first to fourth pixel regions PXR1, PXR2, PXR3, and PXR4, when viewed in a plan view. The deep device isolation pattern 150 may include first portions 150P1, which are respectively extended into regions between the first and second pixel regions PXR1 and PXR2 and between the third and fourth pixel regions PXR3 and PXR4, and second portions 150P2, which are respectively extended into regions between the first and third pixel regions PXR1 and PXR3 and between the second and fourth pixel regions PXR2 and PXR4. The first portions 150P1 may be respectively interposed between the first and second pixel regions PXR1 and PXR2 and between the third and fourth pixel regions PXR3 and PXR4 and may be spaced apart from each other in the second direction D2. Each of the first portions 150P1 may have a bar shape extended in the second direction D2. The second portions 150P2 may be respectively interposed between the first and third pixel regions PXR1 and PXR3 and between the second and fourth pixel regions PXR2 and PXR4 and may be spaced apart from each other in the first direction D1. Each of the second portions 150P2 may have a bar shape extended in the first direction D1.

The first to fourth pixel regions PXR1, PXR2, PXR3, and PXR4 may be partially separated from each other by the first and second portions 150P1 and 150P2 of the deep device isolation pattern 150. In an embodiment, the first and second pixel regions PXR1 and PXR2 may be partially separated from each other by one of the first portions 150P1 of the deep device isolation pattern 150, and the third and fourth pixel regions PXR3 and PXR4 may be partially separated from each other by another of the first portions 150P1 of the deep device isolation pattern 150. The first and third pixel regions PXR1 and PXR3 may be partially separated from each other by one of the second portions 150P2 of the deep device isolation pattern 150, and the second and fourth pixel regions PXR2 and PXR4 may be partially separated from each other by another of the second portions 150P2 of the deep device isolation pattern 150. Since the first portions 150P1 are spaced apart from each other in the second direction D2 and the second portions 150P2 are spaced apart from each other in the first direction D1, the first to fourth pixel regions PXR1, PXR2, PXR3, and PXR4 of the substrate 100 may be partially connected to each other.

Each of the pixel regions PXR1, PXR2, PXR3, and PXR4 may include a photoelectric conversion region 110. The substrate 100 may have a first conductivity type, and the photoelectric conversion region 110 may be an impurity region that is of a second conductivity type different from the first conductivity type. In an embodiment, the first conductivity type and the second conductivity type may be a p-type and an n-type, respectively. In this case, the impurity of the second conductivity type may contain n-type impurities (e.g., phosphorus, arsenic, bismuth, and/or antimony). The photoelectric conversion region 110 and the substrate 100 may form a pn junction serving as a photodiode. In an embodiment, the semiconductor pattern 152 or 154 of the deep device isolation pattern 150 may be formed of or include a doped semiconductor material which contains impurities of the first conductivity type (e.g., p-type).

A shallow device isolation pattern 105 may be disposed adjacent to the first surface 100a of the substrate 100. Each of the pixel regions PXR1, PXR2, PXR3, and PXR4 may include active patterns ACT, EACT1, and EACT2, which are defined by the shallow device isolation pattern 105. The shallow device isolation pattern 105 may be formed of or include at least one, for example, silicon oxide, silicon nitride, and silicon oxynitride.

Each of the first to fourth pixel regions PXR1, PXR2, PXR3, and PXR4 may include the active pattern ACT defined by the shallow device isolation pattern 105. The first and second pixel regions PXR1 and PXR2 may further include a first extended active pattern EACT1 defined by the shallow device isolation pattern 105. The first extended active pattern EACT1 may be extended from the first pixel region PXR1 to the second pixel region PXR2 in the first direction D1. The third and fourth pixel regions PXR3 and PXR4 may further include a second extended active pattern EACT2 defined by the shallow device isolation pattern 105. The second extended active pattern EACT2 may be extended from the third pixel region PXR3 to the fourth pixel region PXR4 in the first direction D1.

The first and second extended active patterns EACT1 and EACT2 may be disposed between the first portions 150P1 of the deep device isolation pattern 150. The second portions 150P2 of the deep device isolation pattern 150 may be disposed between the first and second extended active patterns EACT1 and EACT2. The shallow device isolation pattern 105 may be interposed between the first portions 150P1 of the deep device isolation pattern 150, between the first and second extended active patterns EACT1 and EACT2, and between the second portions 150P2 of the deep device isolation pattern 150.

The deep device isolation pattern 150 may be provided to penetrate the shallow device isolation pattern 105 and may be extended into the substrate 100. The gap-fill insulating pattern 158 of the deep device isolation pattern 150 may be disposed in the shallow device isolation pattern 105. The gap-fill insulating pattern 158 may be provided to penetrate the shallow device isolation pattern 105 and to be in contact with the semiconductor pattern 152 or 154. The sidewall insulating pattern 156 of the deep device isolation pattern 150 may be extended into a region between the shallow device isolation pattern 105 and the gap-fill insulating pattern 158.

The transfer gate electrode TG and the floating diffusion region FD may be disposed on the first surface 100a of the substrate 100 and on each of the pixel regions PXR1, PXR2, PXR3, and PXR4. As an example, the transfer gate electrode TG and the floating diffusion region FD may be disposed on the active pattern ACT of each of the first to fourth pixel regions PXR1, PXR2, PXR3, and PXR4. The transfer gate electrode TG and the floating diffusion region FD may constitute the transfer transistor TX of FIG. 2. A lower portion of the transfer gate electrode TG may be provided to penetrate the active pattern ACT and may be extended into the substrate 100. An upper portion of the transfer gate electrode TG may protrude above a top surface of the active pattern ACT (i.e., the first surface 100a of the substrate 100). The floating diffusion region FD may be disposed in a portion of the active pattern ACT located at a side of the transfer gate electrode TG. The floating diffusion region FD may be a doped region, which is of the second conductivity type (e.g., an n-type) different from the first conductivity type of the substrate 100.

A plurality of gate electrodes EG1, G1, EG2, and G2 may be disposed on the first surface 100a of the substrate 100 and on the first and second extended active patterns EACT1 and EACT2. The gate electrodes EG1, G1, EG2, and G2 may include a first gate electrode G1 and a first extended gate electrode EG1, which are provided on the first extended active pattern EACT1, and a second gate electrode G2 and a second extended gate electrode EG2, which are provided on the second extended active pattern EACT2. The first gate electrode G1 and the first extended gate electrode EG1 may be spaced apart from each other, on the first extended active pattern EACT1. The first extended gate electrode EG1 may be provided on the first pixel region PXR1 and may be extended to the second pixel region PXR2. That is, a portion of the first extended gate electrode EG1 may be overlapped with the first pixel region PXR1 vertically (e.g., in the third direction D3), and another portion of the first extended gate electrode EG1 may be overlapped with the second pixel region PXR2 vertically (e.g., in the third direction D3). The second gate electrode G2 and the second extended gate electrode EG2 may be spaced apart from each other on the second extended active pattern EACT2. The second extended gate electrode EG2 may be provided on the third pixel region PXR3 and may be extended to the fourth pixel region PXR4. That is, a portion of the second extended gate electrode EG2 may be overlapped with the third pixel region PXR3 vertically (e.g., in the third direction D3), and another portion of the second extended gate electrode EG2 may be overlapped with the fourth pixel region PXR4 vertically (e.g., in the third direction D3).

Source/drain regions SD may be disposed in portions of the first extended active pattern EACT1, which are placed at both sides of each of the first gate electrode G1 and the first extended gate electrode EG1, and in portions of the second extended active pattern EACT2, which are placed at both sides of each of the second gate electrode G2 and the second extended gate electrode EG2. In an embodiment, the source/drain regions SD may be doped regions, which are of the second conductivity type (e.g., the n-type) different from the first conductivity type of the substrate 100.

The first gate electrode G1, the first extended gate electrode EG1, the second gate electrode G2, the second extended gate electrode EG2, and the source/drain regions SD may constitute the driving transistor DX, the selection transistor SX, and the reset transistor RX of FIG. 2. As an example, at least one of the first gate electrode G1, the first extended gate electrode EG1, the second gate electrode G2, and the second extended gate electrode EG2 may be used as a driving gate electrode of the driving transistor DX of FIG. 2, and at least another one of the first gate electrode G1, the first extended gate electrode EG1, the second gate electrode G2, and the second extended gate electrode EG2 may be used as a selection gate electrode of the selection transistor SX of FIG. 2. At least still another one of the first gate electrode G1, the first extended gate electrode EG1, the second gate electrode G2 and the second extended gate electrode EG2 may be used as a reset gate electrode of the reset transistor RX of FIG. 2.

A gate dielectric layer GI may be interposed between the transfer gate electrode TG and the substrate 100 (i.e., the active pattern ACT), between each of the first gate electrode G1 and the first extended gate electrode EG1 and the substrate 100 (i.e., the first extended active pattern EACT1), and between each of the second gate electrode G2 and the second extended gate electrode EG2 and the substrate 100 (i.e., the second extended active pattern EACT2).

The interconnection layer 20 may be disposed on the first surface 100a of the substrate 100. The interconnection layer 20 may include a first interlayer insulating layer 210 and a second interlayer insulating layer 240, which are sequentially stacked on the first surface 100a of the substrate 100. The first interlayer insulating layer 210 may be disposed on the first surface 100a of the substrate 100 to cover the gate electrodes TG, G1, EG1, G2, and EG2. The interconnection layer 20 may further include contact plugs 220, which are connected to the gate electrodes TG, G1, EG1, G2, and EG2, the floating diffusion region FD, and the source/drain regions SD, and conductive lines 230, which are connected to the contact plugs 220. The contact plugs 220 may be provided to penetrate the first interlayer insulating layer 210 and may be connected to the gate electrodes TG, G1, EG1, G2, and EG2, the floating diffusion region FD, and the source/drain regions SD. The conductive lines 230 may be disposed in the second interlayer insulating layer 240. At least some of the contact plugs 220 may be extended into the second interlayer insulating layer 240 and may be connected to the conductive lines 230. The first and second interlayer insulating layers 210 and 240 may be formed of or include at least one of insulating materials, and the contact plugs 220 and the conductive lines 230 may be formed at least one of conductive materials.

The optically-transparent layer 30 may be disposed on the second surface 100b of the substrate 100. The optically-transparent layer 30 may include a color filter array 320 and a micro lens array 330, which are disposed on the second surface 100b of the substrate 100. The color filter array 320 may be disposed between the second surface 100b of the substrate 100 and the micro lens array 330. The optically-transparent layer 30 may be configured to condense and filter an incident light from the outside light and thereby to provide the light into the photoelectric conversion layer 10.

The color filter array 320 may include a plurality of color filters 320, which are disposed on the pixel regions PXR1, PXR2, PXR3, and PXR4, respectively. In an embodiment, the color filters 320 on the first to fourth pixel regions PXR1, PXR2, PXR3, and PXR4 may be configured to realize the same color. The micro lens array 330 may include a plurality of micro lenses 330 disposed on the color filters 320, respectively. Each of the micro lenses 330 may be disposed to be overlapped with the photoelectric conversion region 110 of a corresponding pixel region PXR1, PXR2, PXR3, or PXR4 vertically (e.g., in the third direction D3).

An anti-reflection layer 310 may be interposed between the second surface 100b of the substrate 100 and the color filter array 320. The anti-reflection layer 310 may be configured to prevent light, which is incident into the substrate 100 through the second surface 100b, from being reflected, and thus, it may be possible to effectively guide the light into the photoelectric conversion region 110. A first insulating layer 312 may be interposed between the anti-reflection layer 310 and the color filter array 320, and a second insulating layer 322 may be interposed between the color filter array 320 and the micro lens array 330. A grid 315 may be interposed between the first insulating layer 312 and the color filter array 320. The grid 315 may be vertically overlapped with the deep device isolation pattern 150. The grid 315 may guide light, which is incident into the substrate 100 through the second surface 100b, into the photoelectric conversion region 110. The grid 315 may be formed of or include at least one of metallic materials. The color filter array 320 may be extended into a region between adjacent ones of the grids 315 and may be in contact with the first insulating layer 312.

According to an embodiment of the present disclosure, the first portions 150P1 of the deep device isolation pattern 150 may be respectively interposed between the first and second pixel regions PXR1 and PXR2 and between the third and fourth pixel regions PXR3 and PXR4, and the second portions 150P2 of the deep device isolation pattern 150 may be respectively interposed between the first and third pixel regions PXR1 and PXR3 and between the second and fourth pixel regions PXR2 and PXR4. Accordingly, it may be possible to minimize cross-talk between the first to fourth pixel regions PXR1, PXR2, PXR3, and PXR4.

In addition, the first portions 150P1 of the deep device isolation pattern 150 may be spaced apart from each other in the second direction D2, and the first and second extended active patterns EACT1 and EACT2 may be disposed between the first portions 150P1. The first extended active pattern EACT1 may be extended from the first pixel region PXR1 to the second pixel region PXR2 in the first direction D1, and the second extended active pattern EACT2 may be extended from the third pixel region PXR3 to the fourth pixel region PXR4 in the first direction D1. Since each of the first and second extended active patterns EACT1 and EACT2 is extended to the pixel regions which are adjacent to each other, it may be possible to increase sizes of the gate electrodes (e.g., the first and second extended gate electrodes EG1 and EG2), which are disposed on each of the first and second extended active patterns EACT1 and EACT2. As a result, it may be possible to prevent a reduction in size of the gate electrode, which occurs when an integration density of the image sensor is increased, and the consequent deterioration in characteristics of the gate electrode.

Accordingly, in an image sensor according to an embodiment of the present disclosure, it may be possible to minimize cross-talk between adjacent ones of the pixels and to increase a size of a gate electrode, and this may make it possible to increase an integration density of the image sensor.

FIGS. 5A to 7A show sectional views, which are taken along the line A-A' of FIG. 3, to illustrate a method of fabricating an image sensor according to an embodiment of the present disclosure. FIGS. 5B to 7B show sectional views, which are taken along the line B-B' of FIG. 3, to illustrate a method of fabricating an image sensor according to an embodiment of the present disclosure. FIGS. 5C to 7C show sectional views, which are taken along the line C-C' of FIG. 3, to illustrate a method of fabricating an image sensor according to an embodiment of the present disclosure. For the sake of brevity, an element described herein with reference to FIGS. 1 to 3 and 4A to 4C may be identified by the same or like reference number without repeating overlapping description thereof.

Referring to FIGS. 3 and 5A to 5C, the substrate 100 having the first surface 100a and the second surface 100b, which are disposed opposite to each other, may be provided, such as in sections 500A, 500B and 500C. The substrate 100 may have a first conductivity type (e.g., p-type). A first trench T1 may be formed near the first surface 100a of the substrate 100. The formation of the first trench T1 may include forming a first mask pattern 103 on the first surface 100a of the substrate 100 and etching the substrate 100 using the first mask pattern 103 as an etch mask. The first trench T1 may define the active patterns ACT, EACT1, and EACT2 in the substrate 100.

A device isolation layer 105L may be formed on the first surface 100a of the substrate 100. The device isolation layer 105L may be formed to cover the first mask pattern 103 and to cover the first trench T1. The device isolation layer 105L may be formed of or include at least one of, for example, a silicon oxide layer, a silicon nitride layer, and/or a silicon oxynitride layer.

A second trench T2 may be formed in the substrate 100. The formation of the second trench T2 may include forming a second mask pattern (not shown) on the device isolation layer 105L to define a region, in which the second trench T2 will be formed, and etching the device isolation layer 105L and the substrate 100 using the second mask pattern as an etch mask. The second trench T2 may define a plurality of pixel regions PXR1, PXR2, PXR3, and PXR4 in the substrate 100. Each of the pixel regions PXR1, PXR2, PXR3, and PXR4 may include the active patterns ACT, EACT1, and EACT2, which are defined by the first trench T1.

The pixel regions PXR1, PXR2, PXR3, and PXR4 may include a first pixel region PXR1, a second pixel region PXR2, a third pixel region PXR3, and a fourth pixel region PXR4, which are adjacent to each other in the first and second directions D1 and D2. In an embodiment, the first and second pixel regions PXR1 and PXR2 may be adjacent to each other in the first direction D1, and the third pixel region PXR3 may be adjacent to the first pixel region PXR1 in the second direction D2. The fourth pixel region PXR4 may be adjacent to the second pixel region PXR2 in the second direction D2 and may be adjacent to the third pixel region PXR3 in the first direction D1. The arrangement of the first to fourth pixel regions PXR1, PXR2, PXR3, and PXR4 may be limited to the afore-described structure.

The second trench T2 may be provided to enclose the first to fourth pixel regions PXR1, PXR2, PXR3, and PXR4, when viewed in a plan view. The second trench T2 may be extended in the second direction D2 between the first and second pixel regions PXR1 and PXR2 and between the third and fourth pixel regions PXR3 and PXR4 and may be extended in the first direction D1 between the first and third pixel regions PXR1 and PXR3 and between the second and fourth pixel regions PXR2 and PXR4. The first to fourth pixel regions PXR1, PXR2, PXR3, and PXR4 may be partially separated from each other by the second trench T2, and the first to fourth pixel regions PXR1, PXR2, PXR3, and PXR4 of the substrate 100 may be partially connected to each other.

Each of the first to fourth pixel regions PXR1, PXR2, PXR3, and PXR4 may include the active pattern ACT defined by the first trench T1. The first and second pixel regions PXR1 and PXR2 may further include the first extended active pattern EACT1 defined by the first trench T1. The first extended active pattern EACT1 may be extended from the first pixel region PXR1 to the second pixel region PXR2 in the first direction D1. The third and fourth pixel regions PXR3 and PXR4 may further include the second extended active pattern EACT2 defined by the first trench T1. The second extended active pattern EACT2 may be extended from the third pixel region PXR3 to the fourth pixel region PXR4 in the first direction D1.

Referring to FIGS. 3 and 6A to 6C, the deep device isolation pattern 150 may be formed to fill the second trench T2, such as in sections 600A, 600B and 600C. The deep device isolation pattern 150 may include the sidewall insulating pattern 156 conformally covering an inner surface of the second trench T2, the semiconductor pattern 152 or 154 filling a lower region of the second trench T2, and the gap-fill insulating pattern 158 provided on the semiconductor pattern 152 or 154 to fill a remaining region of the second trench T2. The semiconductor pattern 152 or 154 may include the first semiconductor pattern 152, which is provided to fill a portion of the second trench T2, and the second semiconductor pattern 154, which is provided between the first semiconductor pattern 152 and the sidewall insulating pattern 156.

In an embodiment, the formation of the deep device isolation pattern 150 may include forming a sidewall insulating layer on the device isolation layer 105L to conformally cover an inner surface of the second trench T2, forming a second semiconductor layer on the sidewall insulating layer to fill a portion of the second trench T2, anisotropically etching the second semiconductor layer to form the second semiconductor pattern 154, forming a first semiconductor layer on the second semiconductor pattern 154 to fill the second trench T2, etching the first semiconductor layer in an etch-back manner to form the first semiconductor pattern 152, forming an insulating gapfill layer to fill a remaining region of the second trench T2, and planarizing the insulating gapfill layer and the sidewall insulating layer to form the gap-fill insulating pattern 158 and the sidewall insulating pattern 156. The formation of the second semiconductor pattern 154 may further include injecting impurities of the first conductivity type (e.g., p-type impurities) into the second semiconductor pattern 154. The planarization process for forming the gap-fill insulating pattern 158 and the sidewall insulating pattern 156 may include planarizing the insulating gapfill layer, the sidewall insulating layer, and the device isolation layer 105L to expose the first surface 100a of the substrate 100. As a result of the planarization process, the first mask pattern 103 may be removed, and the shallow device isolation pattern 105 filling the first trench T1 may be formed.

Referring to FIGS. 3 and 7A to 7C, the photoelectric conversion region 110 may be formed in each of the pixel regions PXR1, PXR2, PXR3, and PXR4, such as in sections 700A, 700B and 700C. The formation of the photoelectric conversion region 110 may include injecting impurities, which are of the second conductivity type (e.g., n-type) different from the first conductivity type (e.g., p-type), into the substrate 100.

A thinning process may be performed on the second surface 100b of the substrate 100 to partially remove the substrate 100 and the deep device isolation pattern 150. The thinning process may include grinding or polishing the second surface 100b of the substrate 100 and performing an anisotropic and/or isotropic etching process. As a result of the thinning process, a lower portion of the deep device isolation pattern 150 may be removed, and the deep device isolation pattern 150 may have the bottom surface 150b that is substantially coplanar with the second surface 100b of the substrate 100.

The transfer gate electrode TG and the floating diffusion region FD may be formed on the first surface 100a of the substrate 100 and on each of the pixel regions PXR1, PXR2, PXR3, and PXR4. In an embodiment, the transfer gate electrode TG and the floating diffusion region FD may be formed on the active pattern ACT of each of the first to fourth pixel regions PXR1, PXR2, PXR3, and PXR4. A lower portion of the transfer gate electrode TG may be provided to penetrate the active pattern ACT and may be extended into the substrate 100. An upper portion of the transfer gate electrode TG may protrude above the top surface of the active pattern ACT (i.e., the first surface 100a of the substrate 100). The floating diffusion region FD may be formed by doping impurities (e.g., n-type impurities), which are of the second conductivity type different from the first conductivity type of the substrate 100, into a portion of the active pattern ACT at a side of the transfer gate electrode TG.

A plurality of gate electrodes EG1, G1, EG2, and G2 may be formed on the first surface 100a of the substrate 100 and on the first and second extended active patterns EACT1 and EACT2. The gate electrodes EG1, G1, EG2, and G2 may include the first gate electrode G1 and the first extended gate electrode EG1 on the first extended active pattern EACT1 and the second gate electrode G2 and the second extended gate electrode EG2 on the second extended active pattern EACT2. The first extended gate electrode EG1 may be formed to extend from the first pixel region PXR1 to the second pixel region PXR2, and the second extended gate electrode EG2 may be formed to extend from the third pixel region PXR3 to the fourth pixel region PXR4.

The source/drain regions SD may be formed in two portions of the first extended active pattern EACT1, which are located at both sides of each of the first gate electrode G1 and the first extended gate electrode EG1, and in two portions of the second extended active pattern EACT2, which are located at both sides of each of the second gate electrode G2 and the second extended gate electrode EG2. The source/drain regions SD may be formed by doping impurities (e.g., n-type impurities), which are of the second conductivity type, into the first and second extended active patterns EACT1 and EACT2.

The gate dielectric layer GI may be formed between the transfer gate electrode TG and the substrate 100 (i.e., the active pattern ACT), between each of the first gate electrode G1 and the first extended gate electrode EG1 and the substrate 100 (i.e., the first extended active pattern EACT1), and between each of the second gate electrode G2 and the second extended gate electrode EG2 and the substrate 100 (i.e., the second extended active pattern EACT2).

The photoelectric conversion layer 10 may be formed by the afore-described fabrication process. The interconnection layer 20 may be formed on the first surface 100a of the substrate 100. As an example, the first interlayer insulating layer 210 may be formed on the first surface 100a of the substrate 100 to cover the gate electrodes TG, G1, EG1, G2, and EG2. Some of the contact plugs 220 may be formed to penetrate the first interlayer insulating layer 210 and may be connected to the floating diffusion region FD and corresponding ones of the source/drain regions SD. The second interlayer insulating layer 240 may be formed on the first interlayer insulating layer 210. The others of the contact plugs 220 and the conductive lines 230 may be formed in the second interlayer insulating layer 240. The others of the contact plugs 220 may be formed to penetrate the first and second interlayer insulating layers 210 and 240 and may be connected to corresponding ones of the source/drain regions SD and the gate electrodes TG, G1, EG1, G2, and EG2. The conductive lines 230 may be connected to the contact plugs 220.

Referring back to FIGS. 3 and 4A to 4C, the optically-transparent layer 30 may be formed on the second surface 100b of the substrate 100. In an embodiment, the anti-reflection layer 310 and the first insulating layer 312 may be sequentially formed on the second surface 100b of the substrate 100. The grid 315 may be formed on the first insulating layer 312 and may be vertically overlapped with the deep device isolation pattern 150. In an embodiment, the formation of the grid 315 may include depositing a metal layer on the first insulating layer 312 and patterning the metal layer.

The color filter array 320 may be formed on the first insulating layer 312 to cover the grid 315. The color filter array 320 may include a plurality of color filters 320, and the color filters 320 may be disposed on the pixel regions PXR1, PXR2, PXR3, and PXR4, respectively. The second insulating layer 322 may be formed on the color filter array 320, and the micro lens array 330 may be formed on the second insulating layer 322. The micro lens array 330 may include a plurality of micro lenses 330 which are disposed on the color filters 320, respectively. Each of the micro lenses 330 may be formed to be overlapped with the photoelectric conversion region 110 of a corresponding one of the pixel regions PXR1, PXR2, PXR3, and PXR4 vertically (e.g., in the third direction D3).

Figure 8:
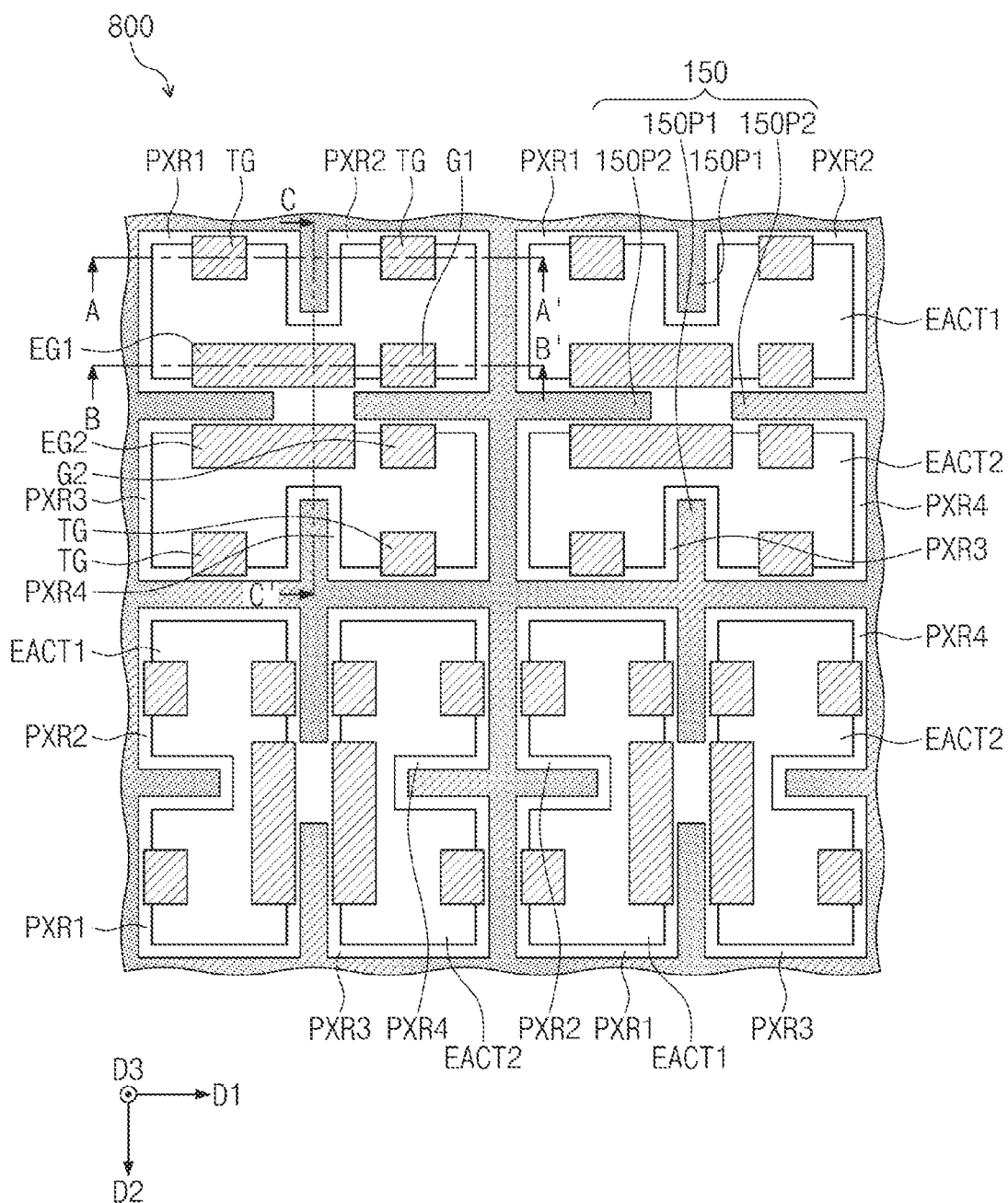
FIG. 8 is a plan view diagram illustrating an image sensor according to an embodiment of the present disclosure.
Figure 9A:
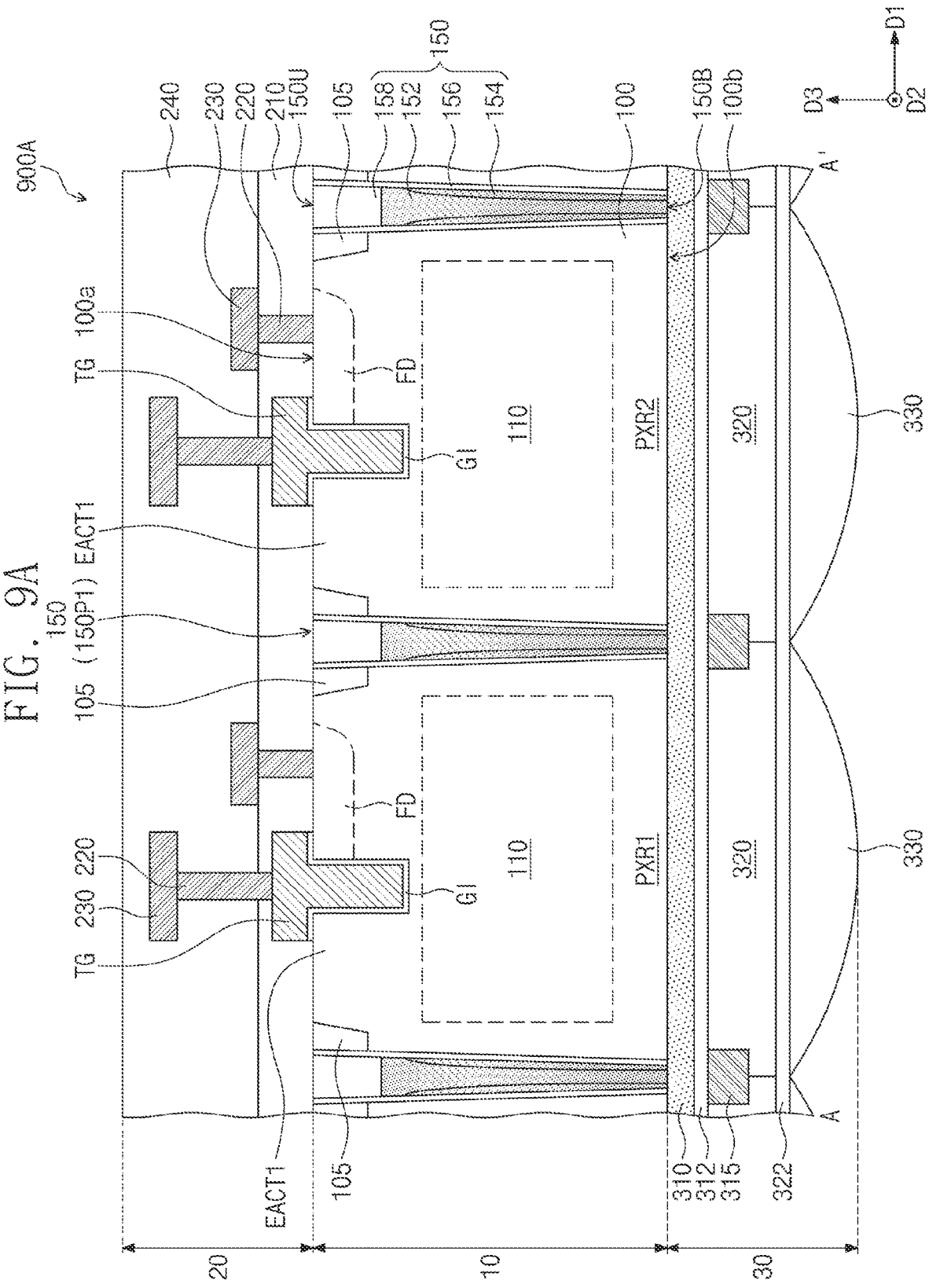
FIGS. 9A, 9B, and 9C are sectional view diagrams taken along lines A-A', B-B' and C-C', respectively, of FIG. 8.
Figure 9B:
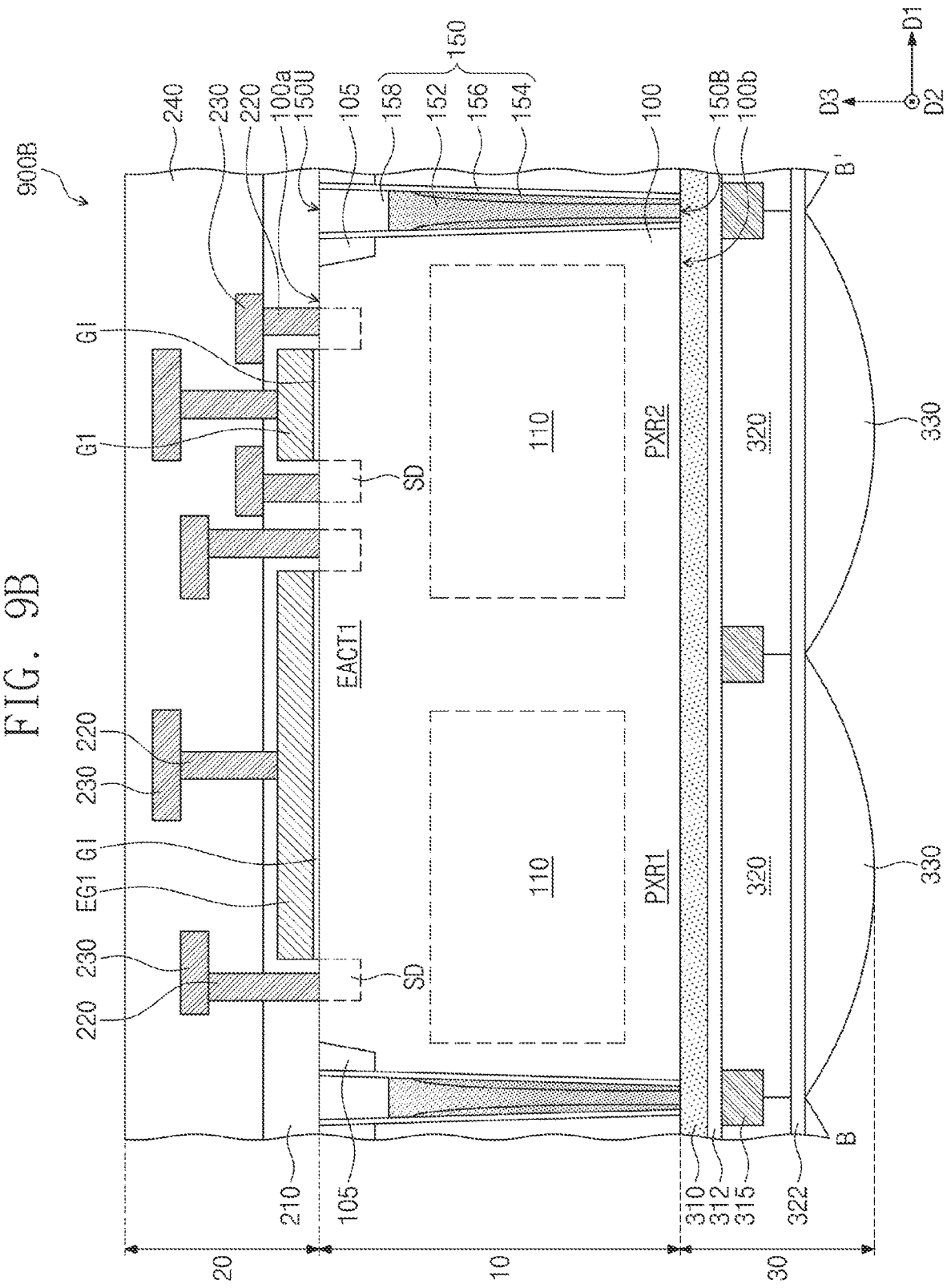
Figure 9C:
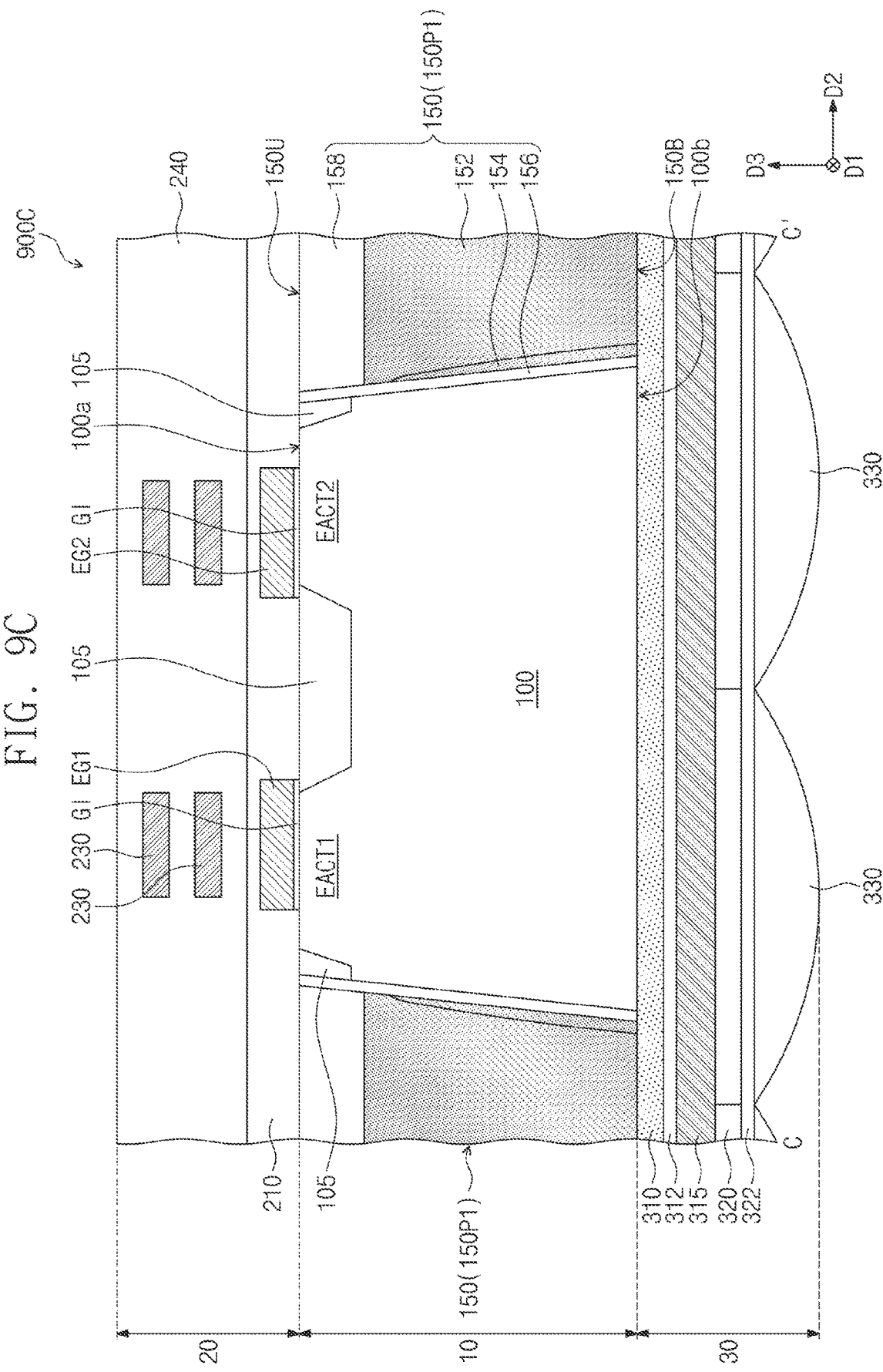

FIG. 8 illustrates an image sensor according to an embodiment of the present disclosure. FIGS. 9A, 9B, and 9C show sectional views taken along lines A-A', B-B' and C-C', respectively, of FIG. 8. For the sake of brevity, features which are different from those of the image sensor of FIGS. 1 to 3 and 4A to 4C will be mainly described below.

Referring to FIGS. 8 and 9A to 9C, the shallow device isolation pattern 105 of the image sensor 800 may be disposed adjacent to the first surface 100a of the substrate 100, such as in sections 900A, 900B and 900C. Each of the pixel regions PXR1, PXR2, PXR3, and PXR4 may include the extended active pattern EACT1 or EACT2 defined by the shallow device isolation pattern 105. In an embodiment, each of the first to fourth pixel regions PXR1, PXR2, PXR3, and PXR4 may include the extended active pattern EACT1 or EACT2 defined by the shallow device isolation pattern 105. The first and second pixel regions PXR1 and PXR2 may include the first extended active pattern EACT1 defined by the shallow device isolation pattern 105. The first extended active pattern EACT1 may be extended from the first pixel region PXR1 to the second pixel region PXR2 in the first direction D1. The third and fourth pixel regions PXR3 and PXR4 may include the second extended active pattern EACT2 defined by the shallow device isolation pattern 105. The second extended active pattern EACT2 may be extended from the third pixel region PXR3 to the fourth pixel region PXR4 in the first direction D1.

The first extended active pattern EACT1 may be extended toward both sides of one of the first portions 150P1 of the deep device isolation pattern 150. Accordingly, the one of the first portions 150P1 of the deep device isolation pattern 150 may be interposed between the first extended active pattern EACT1 on the first pixel region PXR1 and the first extended active pattern EACT1 on the second pixel region PXR2. The second extended active pattern EACT2 may be extended toward both sides of another of the first portions 150P1 of the deep device isolation pattern 150. Accordingly, the another of the first portions 150P1 of the deep device isolation pattern 150 may be interposed between the second extended active pattern EACT2 on the third pixel region PXR3 and the second extended active pattern EACT2 on the fourth pixel region PXR4.

A portion of the first extended active pattern EACT1 and a portion of the second extended active pattern EACT2 may be disposed between the first portions 150P1 of the deep device isolation pattern 150 and may be extended in the first direction D1, between the first portions 150P1 of the deep device isolation pattern 150. The second portions 150P2 of the deep device isolation pattern 150 may be disposed between the first and second extended active patterns EACT1 and EACT2. The shallow device isolation pattern 105 may be interposed between the first portions 150P1 of the deep device isolation pattern 150, between the first and second extended active patterns EACT1 and EACT2, and between the second portions 150P2 of the deep device isolation pattern 150.

The transfer gate electrode TG and the floating diffusion region FD may be disposed on the first surface 100a of the substrate 100 and on each of the pixel regions PXR1, PXR2, PXR3, and PXR4. In an embodiment, the transfer gate electrode TG and the floating diffusion region FD may be disposed on the first extended active pattern EACT1 of each of the first and second pixel regions PXR1 and PXR2 and on the second extended active pattern EACT2 of each of the third and fourth pixel regions PXR3 and PXR4. The transfer gate electrode TG and the floating diffusion region FD may constitute the transfer transistor TX of FIG. 2. A lower portion of the transfer gate electrode TG may be provided to penetrate the first or second extended active pattern EACT1 or EACT2 and may be extended into the substrate 100. An upper portion of the transfer gate electrode TG may protrude above a top surface of the first or second extended active pattern EACT1 or EACT2 (i.e., the first surface 100a of the substrate 100). The floating diffusion region FD may be disposed at a side of the transfer gate electrode TG and may be disposed in the first or second extended active pattern EACT1 or EACT2.

The gate electrodes EG1, G1, EG2, and G2 may be disposed on the first surface 100a of the substrate 100 and on the first and second extended active patterns EACT1 and EACT2. The gate electrodes EG1, G1, EG2, and G2 may include a first gate electrode G1 and a first extended gate electrode EG1, which are provided on the first extended active pattern EACT1, and a second gate electrode G2 and a second extended gate electrode EG2, which are provided on the second extended active pattern EACT2. The first extended gate electrode EG1 may be extended from the first pixel region PXR1 to the second pixel region PXR2, and the second extended gate electrode EG2 may be extended from the third pixel region PXR3 to the fourth pixel region PXR4. The source/drain regions SD may be disposed in portions of the first extended active pattern EACT1, which are located at both sides of each of the first gate electrode G1 and the first extended gate electrode EG1, and in portions of the second extended active pattern EACT2, which are located at both sides of each of the second gate electrode G2 and the second extended gate electrode EG2. The first gate electrode G1, the first extended gate electrode EG1, the second gate electrode G2, the second extended gate electrode EG2, and the source/drain regions SD may constitute the driving transistor DX, the selection transistor SX, and the reset transistor RX of FIG. 2.

The gate dielectric layer GI may be interposed between the transfer gate electrode TG and the substrate 100 (i.e., the first or second extended active pattern EACT1 or EACT2), between each of the first gate electrode G1 and the first extended gate electrode EG1 and the substrate 100 (i.e., the first extended active pattern EACT1), and between each of the second gate electrode G2 and the second extended gate electrode EG2 and the substrate 100 (i.e., the second extended active pattern EACT2).

According to the present embodiments, an area of the first extended active pattern EACT1 may be maximized, and adjacent ones of the first and second pixel regions PXR1 and PXR2 may share the first extended active pattern EACT1. In addition, an area of the second extended active pattern EACT2 may be maximized, and adjacent ones of the third and fourth pixel regions PXR3 and PXR4 may share the second extended active pattern EACT2. As the areas of the first and second extended active patterns EACT1 and EACT2 are maximized, the gate electrodes TG, G1, EG1, G2, and EG2 may be more freely disposed and the sizes of the gate electrodes TG, G1, EG1, G2, and EG2 may be readily increased.

In addition, the first portions 150P1 of the deep device isolation pattern 150 may be respectively interposed between the first and second pixel regions PXR1 and PXR2 and between the third and fourth pixel regions PXR3 and PXR4, and the second portions 150P2 of the deep device isolation pattern 150 may be respectively interposed between the first and third pixel regions PXR1 and PXR3 and between the second and fourth pixel regions PXR2 and PXR4. Accordingly, it may be possible to minimize cross-talk between the first to fourth pixel regions PXR1, PXR2, PXR3, and PXR4.

Accordingly, in an image sensor according to an embodiment of the present disclosure, it may be possible to minimize cross-talk between adjacent ones of the pixels and to increase a size of a gate electrode, and this may make it possible to increase an integration density of the image sensor.

Figure 10:
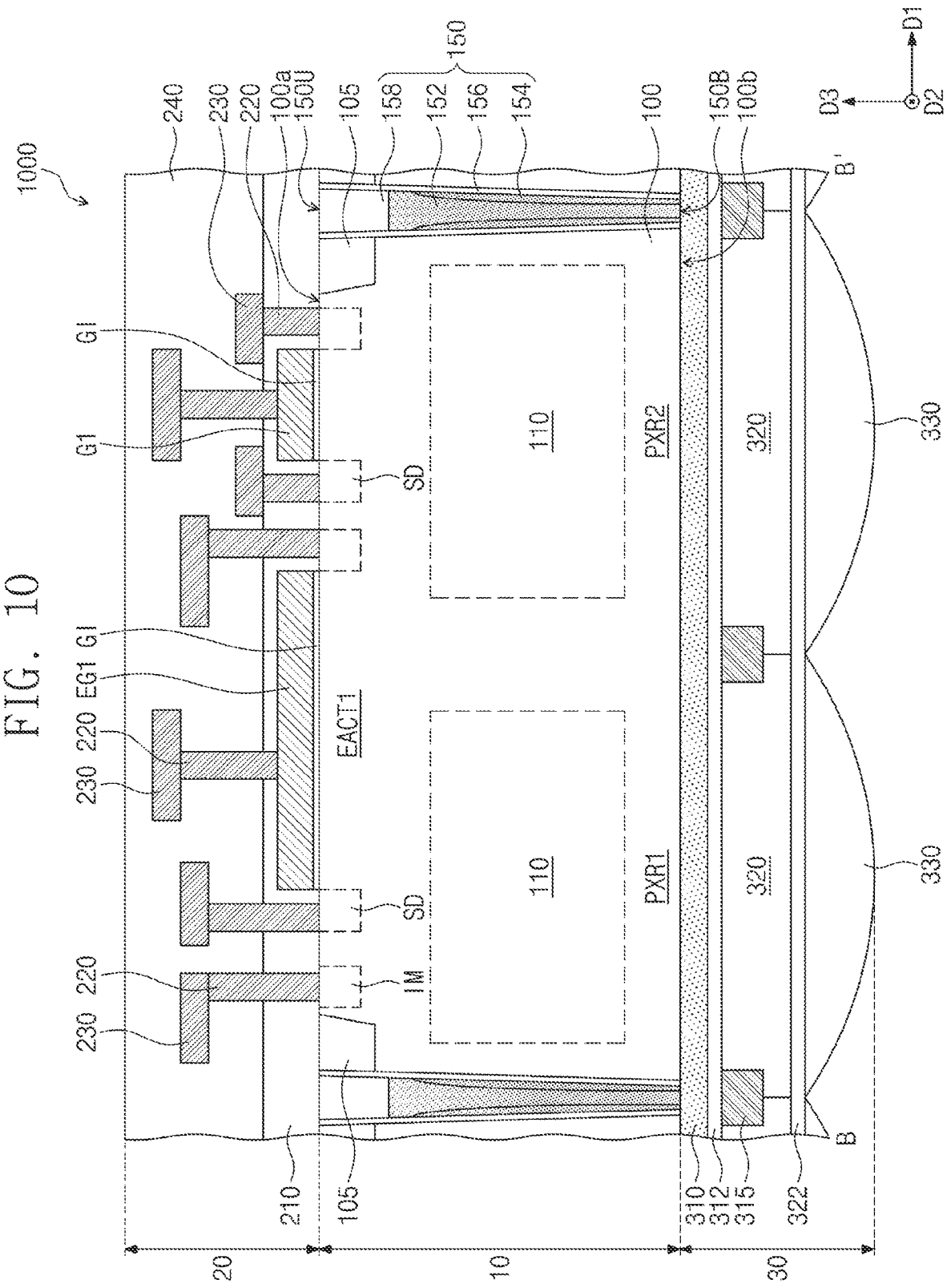
FIG. 10 is a sectional view diagram, which is taken along the line B-B' of FIG. 3 to illustrate an image sensor according to an embodiment of the present disclosure.

FIG. 10 shows a sectional view, which is taken along the line B-B' of FIG. 3 to illustrate an image sensor according to an embodiment of the present disclosure. For the sake of brevity, features which are different from those of the image sensor of FIGS. 1 to 3 and 4A to 4C will be mainly described below.

Referring to FIGS. 3 and 10, a doped region IM may be disposed in the first or second extended active pattern EACT1 or EACT2, such as in section 1000. The doped region IM may have the same conductivity type as the substrate 100. The doped region IM may be a region that is doped with the impurities of the first conductivity type (e.g., p-type impurities). The doped region IM may be electrically connected to a corresponding one of the contact plugs 220 and a corresponding one of the conductive lines 230. A ground voltage may be applied to the substrate 100 through the corresponding conductive line 230, the corresponding contact plug 220, and the doped region IM. In an embodiment, the first portions 150P1 and the second portions 150P2 of the deep device isolation pattern 150 may be spaced apart from each other, and the first to fourth pixel regions PXR1, PXR2, PXR3, and PXR4 of the substrate 100 may be connected to each other. In this case, the ground voltage may be applied in common to the portions of the first to fourth pixel regions PXR1, PXR2, PXR3, and PXR4 of the substrate 100 through the corresponding conductive line 230, the corresponding contact plug 220, and the doped region IM.

FIGS. 11 to 16 show plan views illustrating an image sensor according to an embodiment of the present disclosure. For the sake of brevity, features, which are different from those of the image sensor of FIGS. 1 to 3 and 4A to 4C, will be mainly described below.

Referring to FIGS. 11 to 16, the micro lens array 330 may include a plurality of micro lenses 330 as shown in the image sensors 1100, 1200, 1300, 1400, 1500 and 1600.

Figure 11:
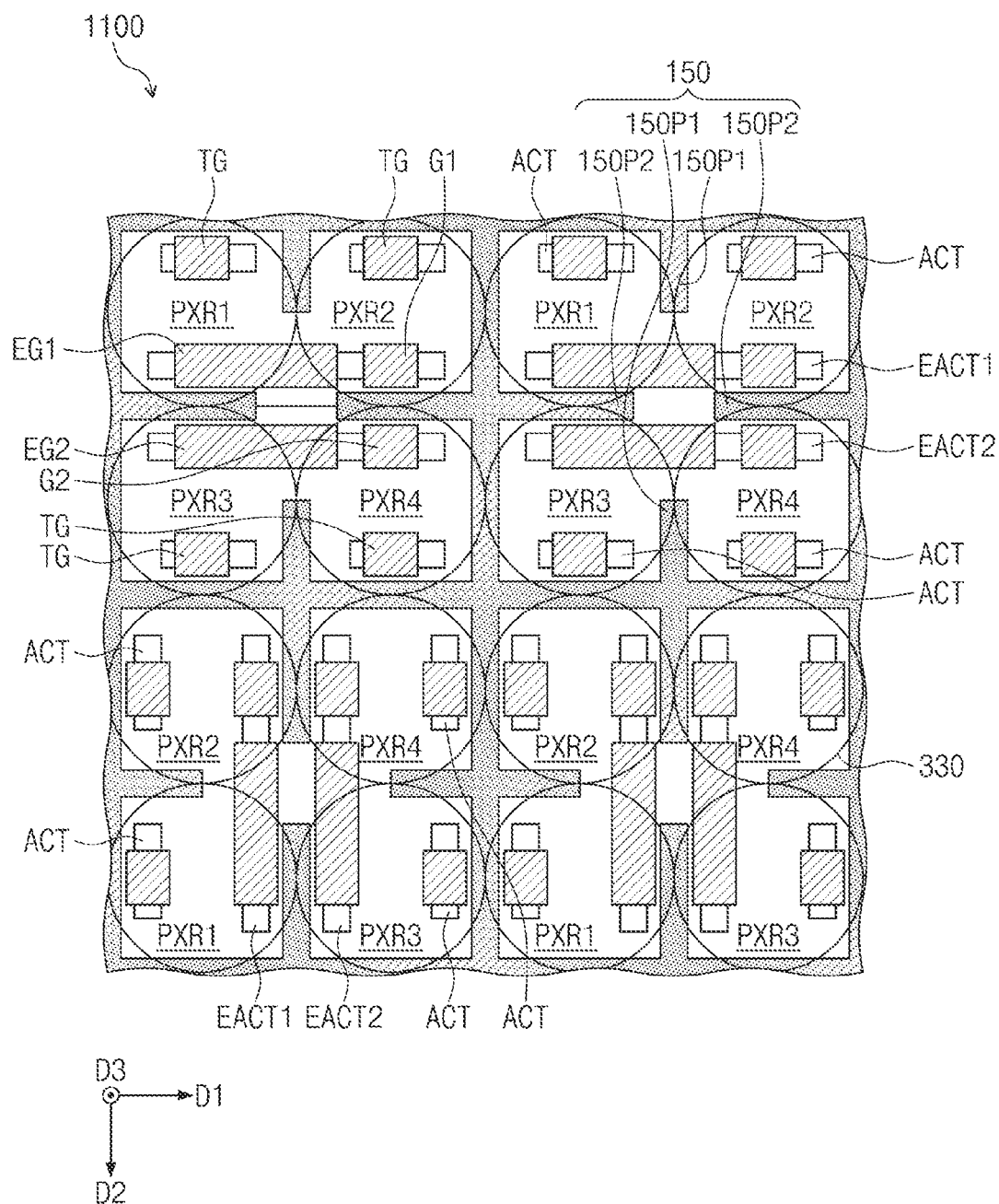
FIGS. 11 to 16 are plan view diagrams illustrating an image sensor according to an embodiment of the present disclosure.

In an embodiment, as shown in FIG. 11, the micro lenses 330 may be disposed on the pixel regions PXR1, PXR2, PXR3, and PXR4, respectively. Each of the micro lenses 330 may be disposed to be overlapped with the photoelectric conversion region 110 of a corresponding one of the pixel regions PXR1, PXR2, PXR3, and PXR4 vertically (e.g., in the third direction D3).

Although the embodiment of FIG. 11 is shown and described with first pixel regions PXR1 disposed in a top left corner of each pixel in a first row but disposed in a bottom left corner of each pixel in a second row, this is for brevity of description and embodiments are not limited thereto. For example, in an alternate embodiment, the different arrangements of pixel regions may vary as a checkerboard pattern rather than by row. Moreover, although these two distinct pixel region arrangements are shown for illustrative purposes, the number of distinct pixel region arrangements may be greater, such as four with the first pixel region in the top right in a third arrangement and in the bottom right in a fourth arrangement.

Figure 12:
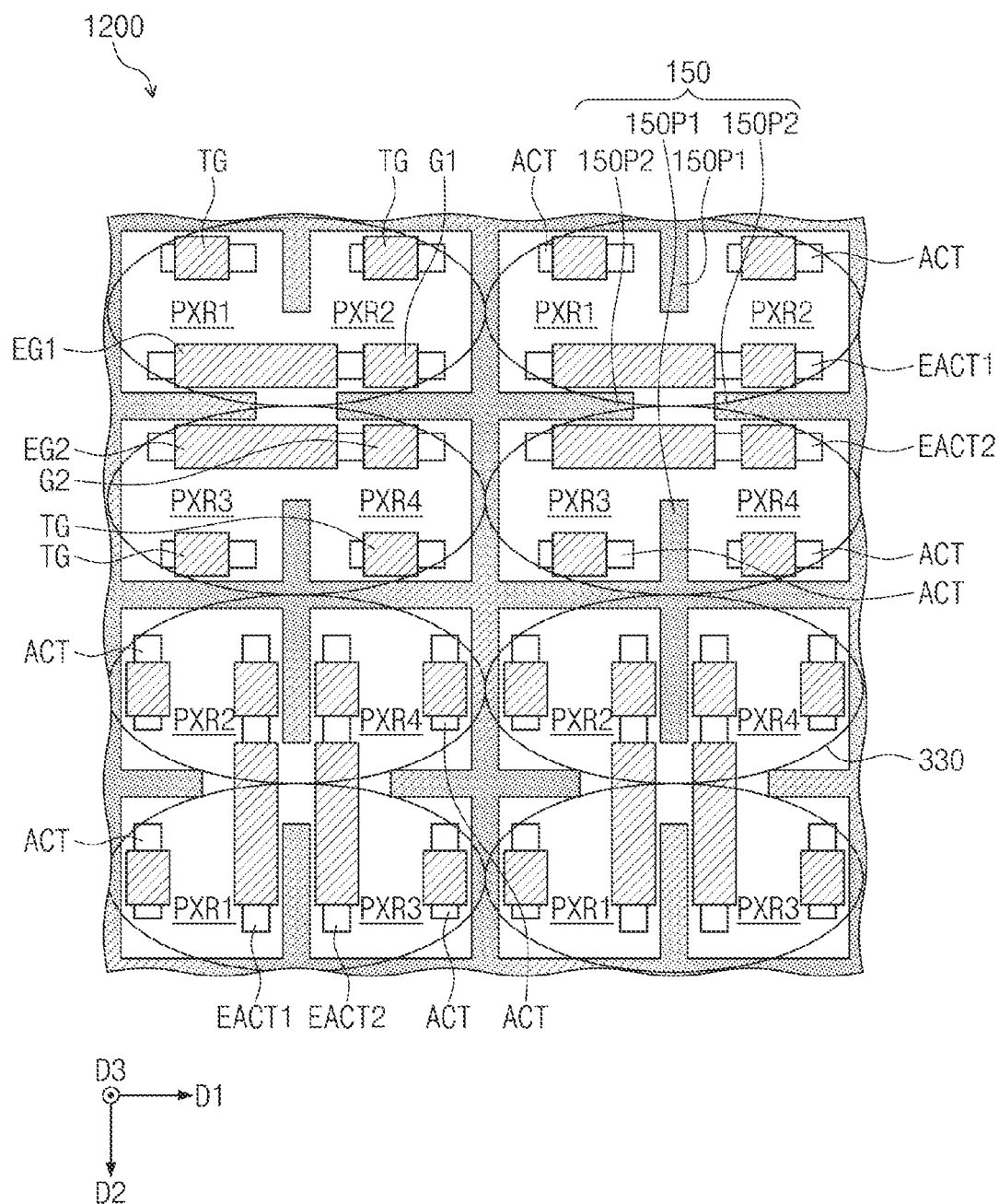
Figure 13:
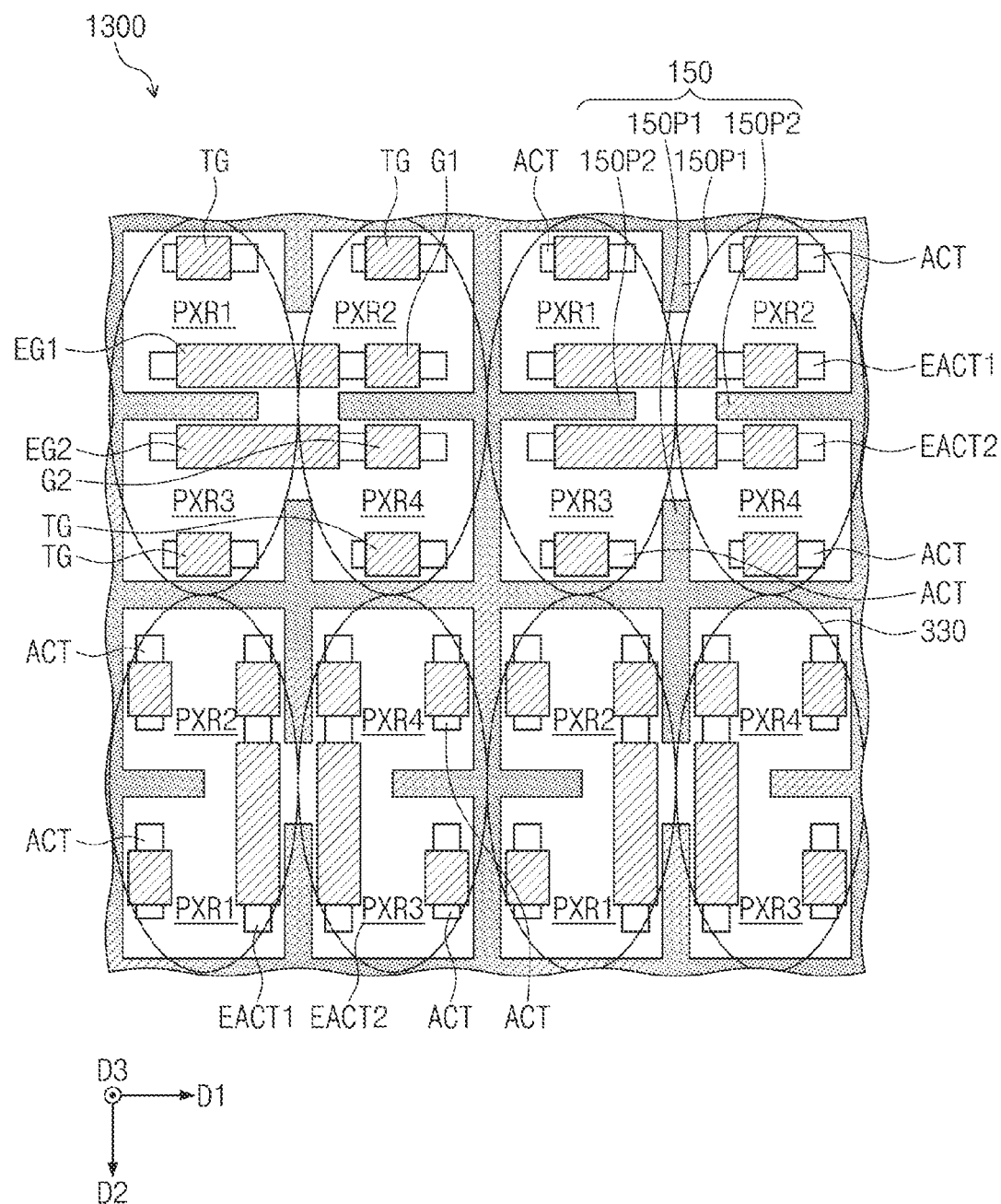
Figure 14:
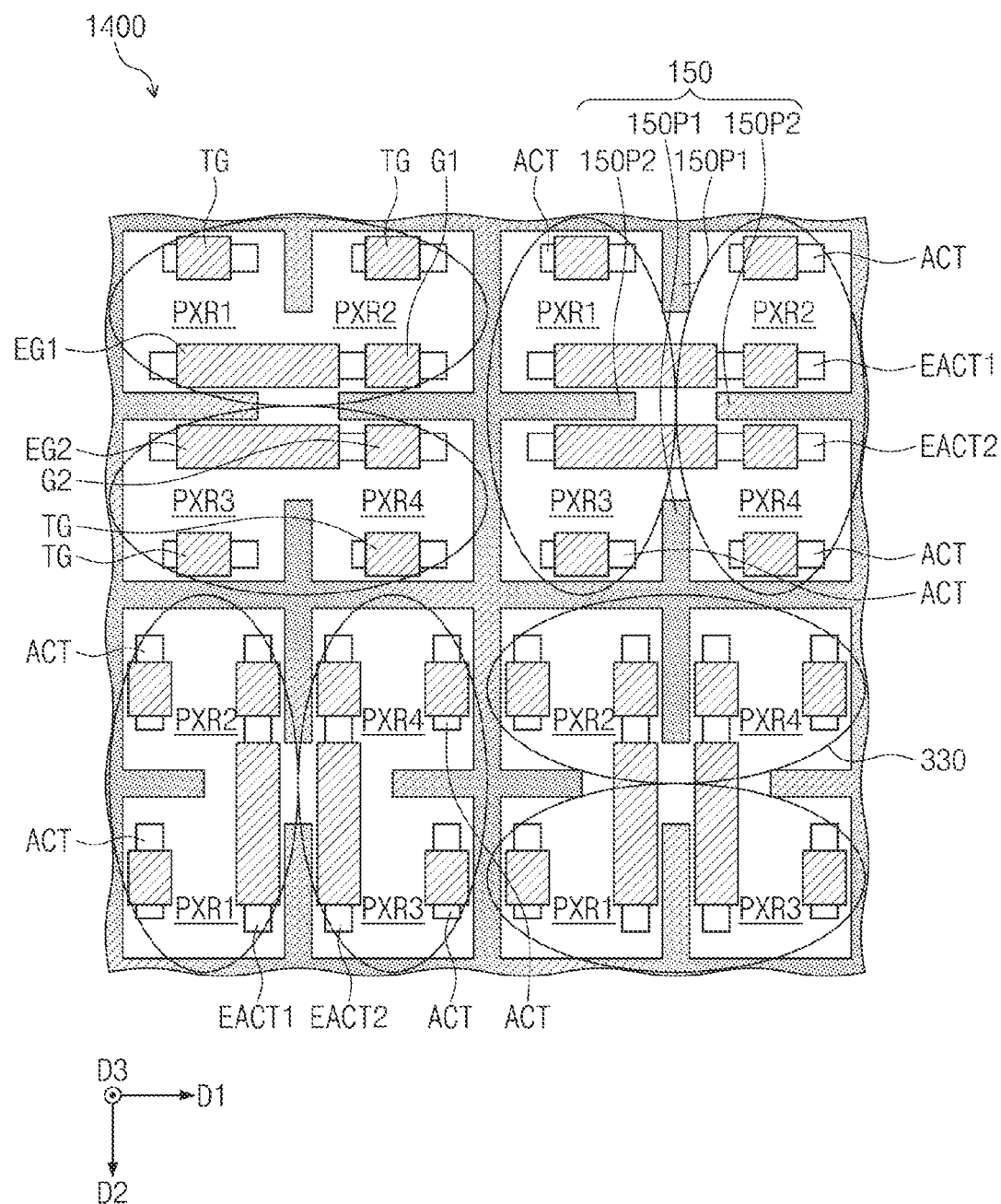

In another embodiment, as shown in FIGS. 12 to 14, each of the micro lenses 330 may be disposed on two pixel regions, which are selected from the pixel regions PXR1, PXR2, PXR3, and PXR4 and are adjacent to each other. Each of the micro lenses 330 may be overlapped with the two pixel regions vertically (e.g., in the third direction D3) and may be vertically (e.g., in the third direction D3) overlapped with the photoelectric conversion regions 110 of the two pixel regions. As an example, as shown in FIG. 12, each of the micro lenses 330 may be disposed on and vertically overlapped with two pixel regions (e.g., the first and second pixel regions PXR1 and PXR2), which are selected from the pixel regions PXR1, PXR2, PXR3, and PXR4 and are adjacent to each other in the first direction D1. As another example, as shown in FIG. 13, each of the micro lenses 330 may be disposed on and vertically overlapped with two pixel regions (e.g., the first and third pixel regions PXR1 and PXR3), which are selected from the pixel regions PXR1, PXR2, PXR3, and PXR4 and are adjacent to each other in the second direction D2. As still other example, as shown in FIG. 14, one of the micro lenses 330 may be disposed on and vertically overlapped with two pixel regions (e.g., the first and second pixel regions PXR1 and PXR2), which are selected from the pixel regions PXR1, PXR2, PXR3, and PXR4 and are adjacent to each other in the first direction D1. Another of the micro lenses 330 may be disposed on and vertically overlapped with two pixel regions (e.g., the first and third pixel regions PXR1 and PXR3), which are selected from the pixel regions PXR1, PXR2, PXR3, and PXR4 and are adjacent to each other in the second direction D2.

Figure 15:
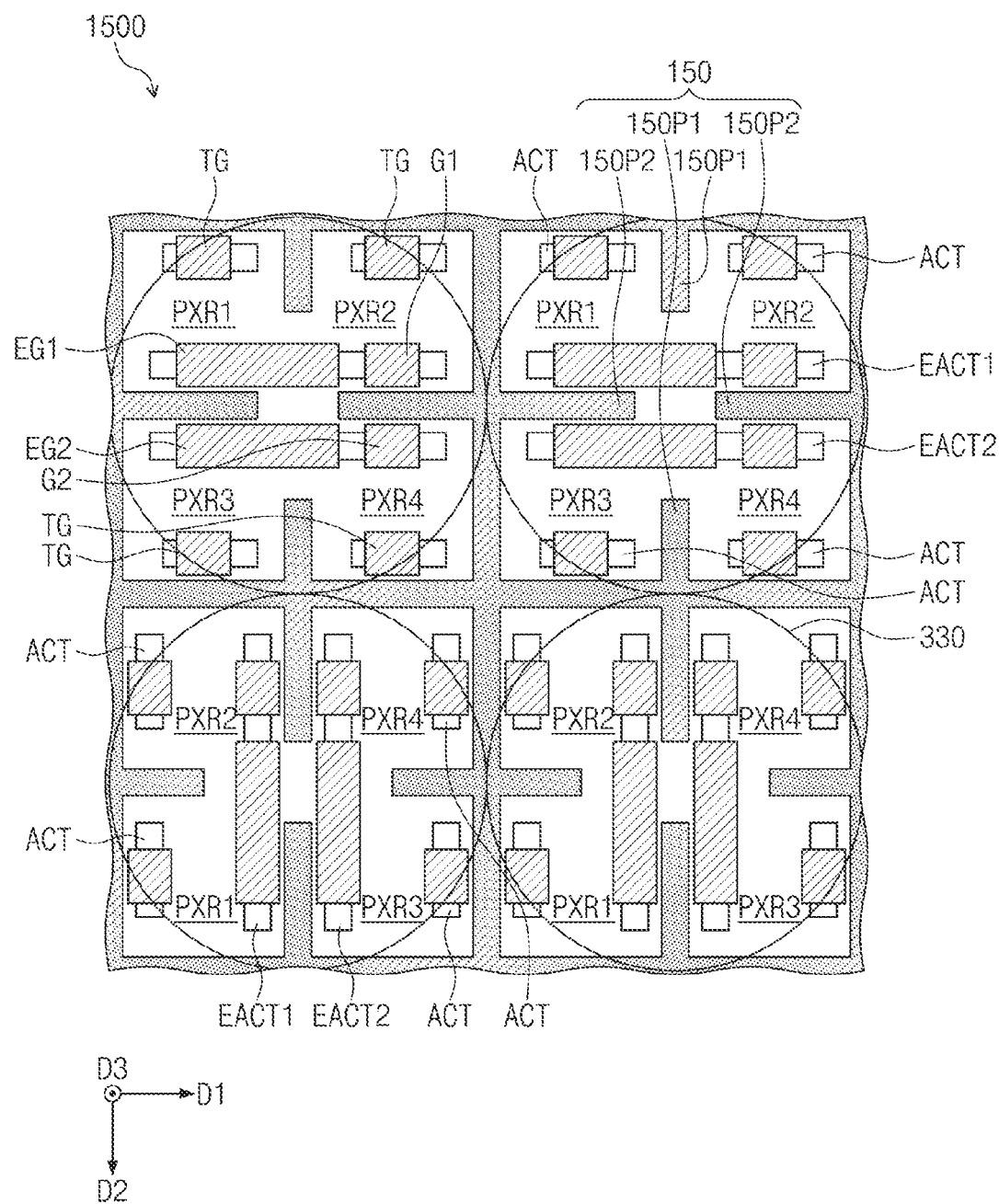

In other embodiment, as shown in FIG. 15, each of the micro lenses 330 may be disposed on four pixel regions (e.g., the first to fourth pixel regions PXR1, PXR2, PXR3, and PXR4), which are selected from the pixel regions PXR1, PXR2, PXR3, and PXR4 and are adjacent to each other. Each of the micro lenses 330 may be vertically (e.g., in the third direction D3) overlapped with the four pixel regions (e.g., the first to fourth pixel regions PXR1, PXR2, PXR3, and PXR4) and may be vertically (e.g., in the third direction D3) overlapped with the photoelectric conversion regions 110 of the four pixel regions (e.g., the first to fourth pixel regions PXR1, PXR2, PXR3, and PXR4).

Figure 16:
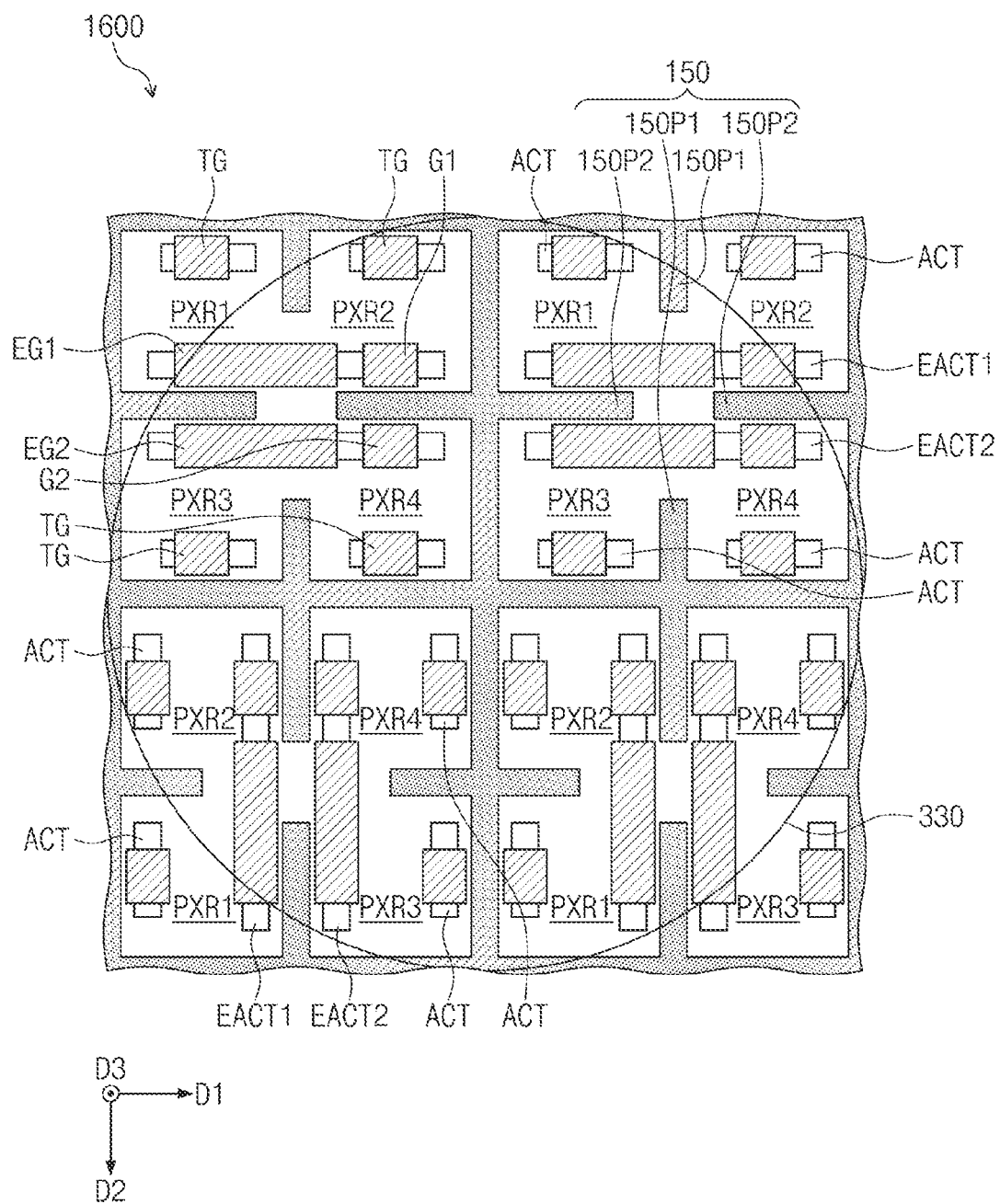

In still other embodiment, as shown in FIG. 16, each of the micro lenses 330 may be disposed on sixteen pixel regions, which are selected from the pixel regions PXR1, PXR2, PXR3, and PXR4 and are adjacent to each other. As an example, the pixel regions PXR1, PXR2, PXR3, and PXR4 may include a plurality of pixel groups which are arranged in the first and second directions D1 and D2. Each of the pixel groups may include the first to fourth pixel regions PXR1, PXR2, PXR3, and PXR4, which are adjacent to each other. Each of the micro lenses 330 may be disposed on and vertically overlapped with at least four pixel groups, which are selected from the pixel groups.

Figure 17A:
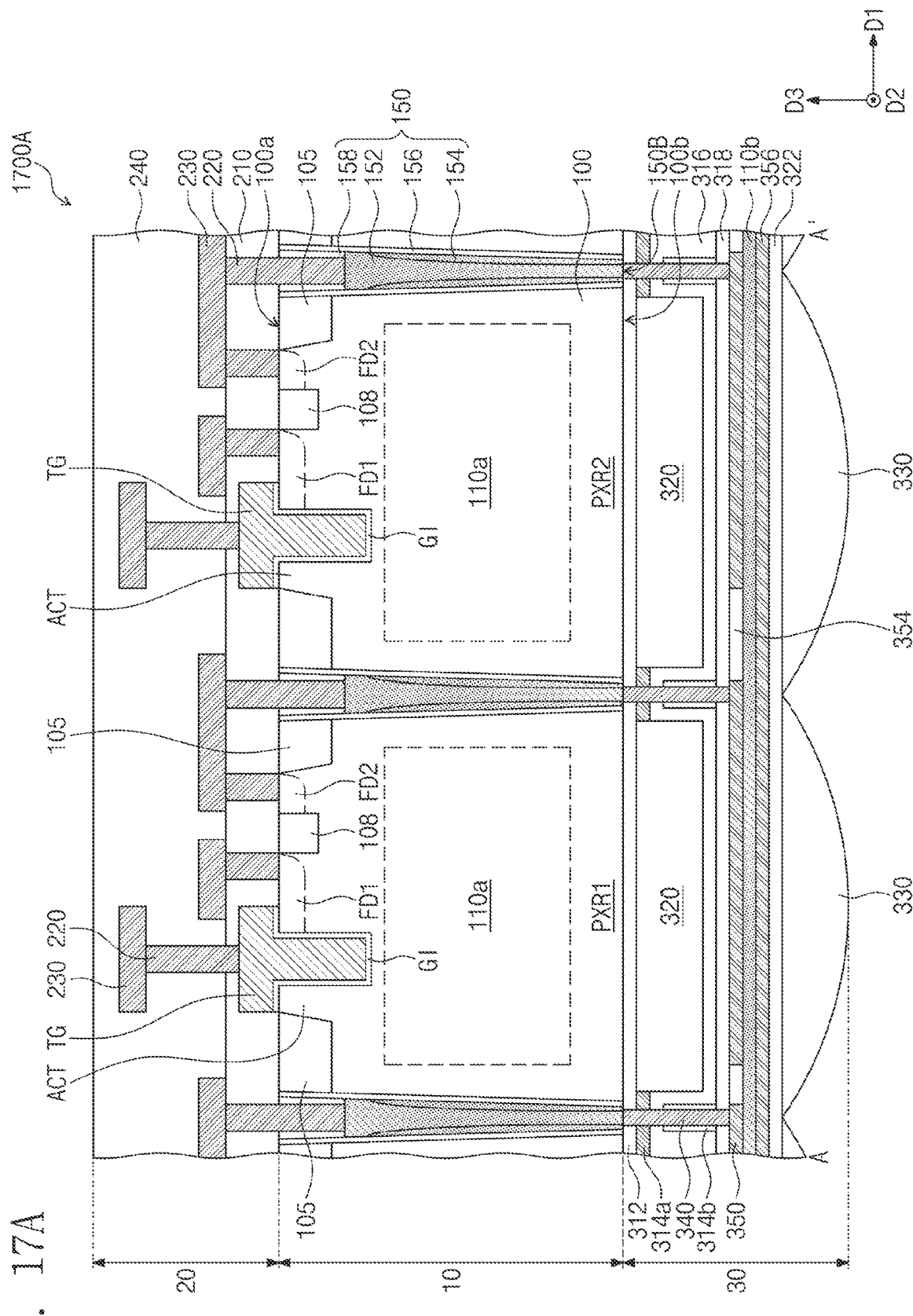
FIGS. 17A, 17B, and 17C are sectional view diagrams, which are respectively taken along the lines A-A', B-B' and C-C' of FIG. 3 to illustrate an image sensor according to an embodiment of the present disclosure.
Figure 17B:
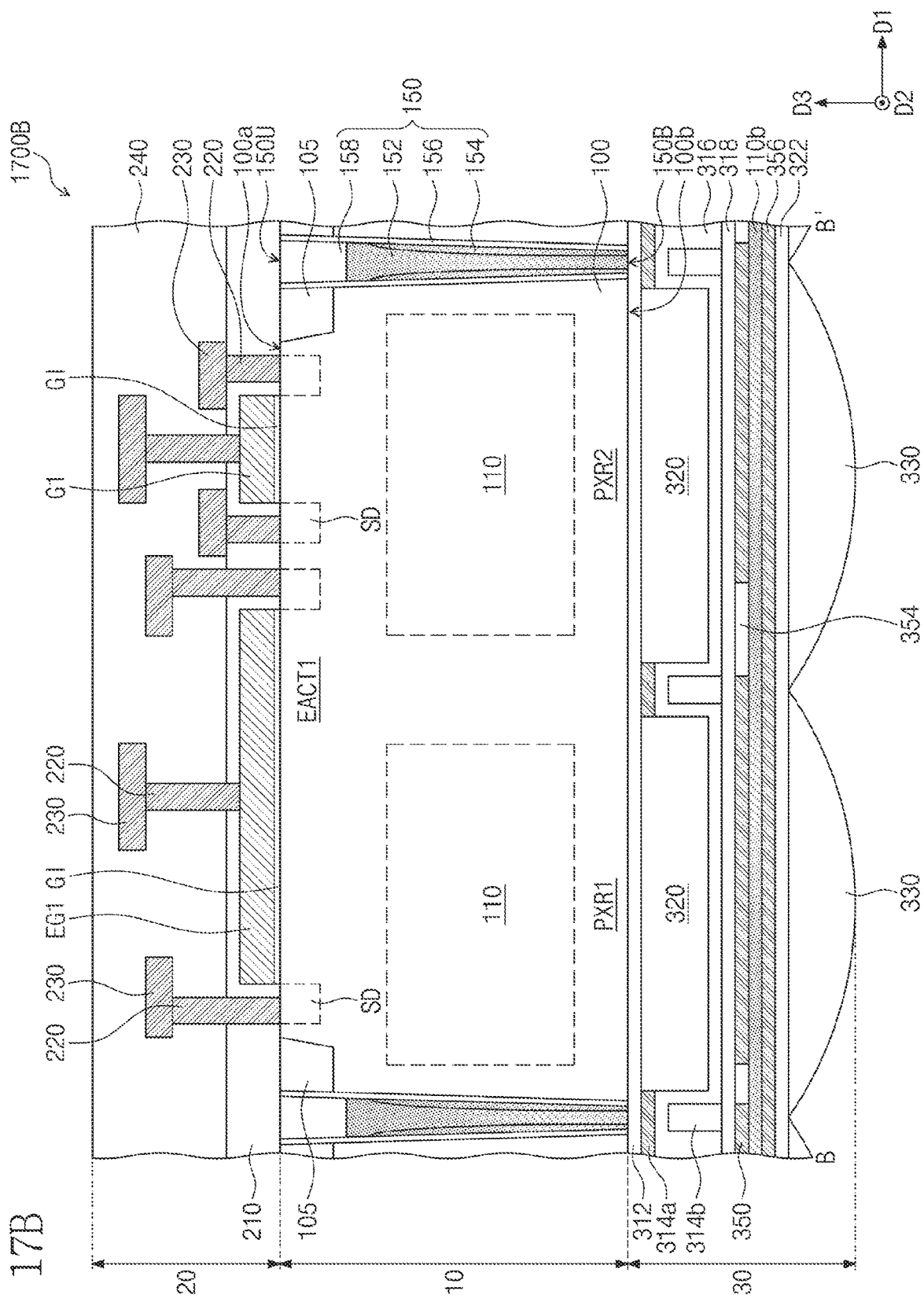
Figure 17C:
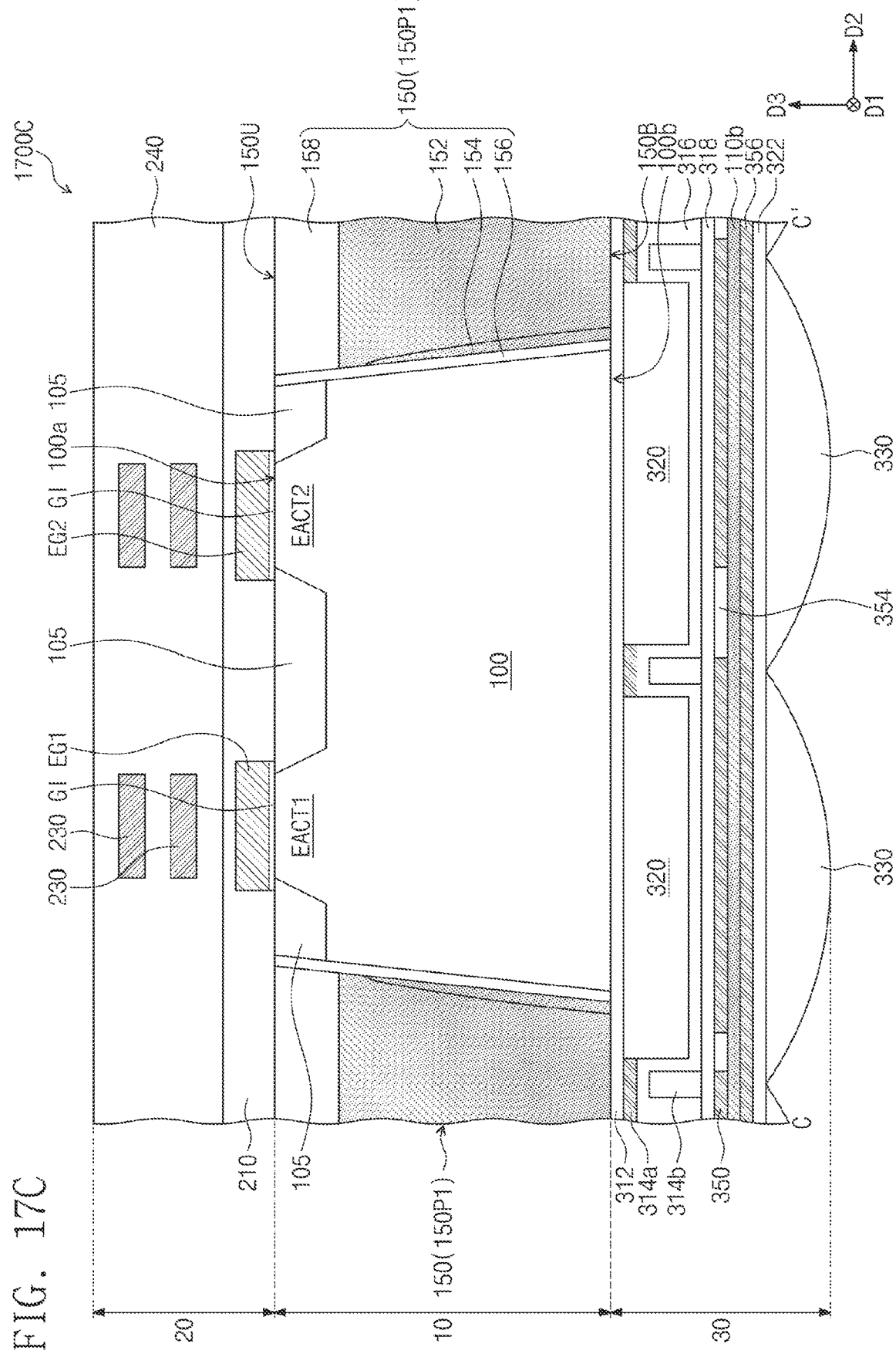

FIGS. 17A, 17B, and 17C show sectional views, which are respectively taken along the lines A-A', B-B' and C-C' of FIG. 3 to illustrate an image sensor according to an embodiment of the present disclosure. For the sake of brevity, features, which are different from those of the image sensor of FIGS. 1 to 3 and 4A to 4C, will be mainly described below.

Referring to FIGS. 3 and 17A to 17C, an insulating isolation pattern 108 may be disposed in the active pattern ACT of each of the pixel regions PXR1, PXR2, PXR3, and PXR4, near(or adjacent to) the first surface 100a of the substrate 100, such as in sections 1700A, 1700B and 1700C. The insulating isolation pattern 108 may be formed of or include at least one of, for example, silicon oxide, silicon nitride, and/or silicon oxynitride.

The transfer gate electrode TG and a first floating diffusion region FD1 may be disposed in the active pattern ACT of each of the pixel regions PXR1, PXR2, PXR3, and PXR4, near(or adjacent to) the first surface 100a of the substrate 100. The transfer gate electrode TG and the first floating diffusion region FD1 may constitute the transfer transistor TX of FIG. 2. A second floating diffusion region FD2 may be disposed in the active pattern ACT of each of the pixel regions PXR1, PXR2, PXR3, and PXR4, near(or adjacent to) the first surface 100a of the substrate 100. The insulating isolation pattern 108 may be interposed between the first floating diffusion region FD1 and the second floating diffusion region FD2. The first and second floating diffusion regions FD1 and FD2 may be impurity regions which are doped with impurities of the second conductivity type (e.g., n-type impurities).

The second floating diffusion region FD2 may be connected to a corresponding one of the contact plugs 220 in the interconnection layer 20. The semiconductor pattern 152 or 154 of the deep device isolation pattern 150 may be connected to a corresponding one of the contact plugs 220 in the interconnection layer 20. The semiconductor pattern 152 or 154 of the deep device isolation pattern 150 may be electrically connected to the second floating diffusion region FD2 through a corresponding one of the contact plugs 220 and a corresponding one of the conductive lines 230.

Each of the pixel regions PXR1, PXR2, PXR3, and PXR4 may include a first photoelectric conversion region 110a. The first photoelectric conversion region 110a may be an impurity region which is doped with impurities of the second conductivity type (e.g., n-type impurities). The first photoelectric conversion region 110a, in conjunction with the substrate 100, may form a pn junction serving as a photodiode.

The optically-transparent layer 30 may be disposed on the second surface 100b of the substrate 100. The optically-transparent layer 30 may include the color filter array 320 and the micro lens array 330, which are disposed on the second surface 100b of the substrate 100. The color filter array 320 may be disposed between the second surface 100b of the substrate 100 and the micro lens array 330. The color filter array 320 may include a plurality of color filters 320, which are respectively disposed on the pixel regions PXR1, PXR2, PXR3, and PXR4, and the micro lens array 330 may include a plurality of micro lenses 330, which are respectively disposed on the color filters 320.

The first insulating layer 312 may be disposed between the second surface 100b of the substrate 100 and the color filter array 320. Light-blocking patterns 314a may be disposed on the first insulating layer 312 and between the color filters 320. Low-refractive patterns 314b may be disposed between the color filters 320 and on the light-blocking patterns 314a, respectively. A third insulating layer 316 may be interposed between each of the light-blocking patterns 314a and each of the low-refractive patterns 314b and may be interposed into a region between each of the color filters 320 and each of the low-refractive patterns 314b. The third insulating layer 316 may be extended into a region between each of the color filters 320 and the micro lens array 330.

Pixel electrodes 350 may be disposed on the pixel regions PXR1, PXR2, PXR3, and PXR4, respectively. The pixel electrodes 350 may be disposed on the color filters 320, respectively, and the third insulating layer 316 may be interposed between the pixel electrodes 350 and the color filters 320. Electrode separation patterns 354 may be disposed between the pixel electrodes 350. A fourth insulating layer 318 may be disposed between the pixel electrodes 350 and the third insulating layer 316 and may be extended into spaces between the electrode separation patterns 354 and the low-refractive patterns 314b.

A second photoelectric conversion layer 110b may be disposed on the pixel electrodes 350 and the electrode separation patterns 354, and a common electrode 356 may be disposed on the second photoelectric conversion layer 110b. The second photoelectric conversion layer 110b may be disposed between the pixel electrodes 350 and the common electrode 356 and between the electrode separation patterns 354 and the common electrode 356. The pixel electrodes 350, the electrode separation patterns 354, the second photoelectric conversion layer 110b, and the common electrode 356 may be disposed between the color filter array 320 and the micro lens array 330. The second photoelectric conversion layer 110b may be, for example, an organic photoelectric conversion layer. The second photoelectric conversion layer 110b may include a p-type organic semiconductor material and an n-type organic semiconductor material, which are provided to form a pn junction. Alternatively, the second photoelectric conversion layer 110b may include a quantum dot or a chalcogenide material. The pixel electrodes 350 and the common electrode 356 may be formed of or include at least one of, for example, indium tin oxide (ITO), indium zinc oxide (IZO), zinc oxide (ZnO), and/or organic transparent conductive materials.

Each of the pixel electrodes 350 may be electrically connected to the semiconductor pattern 152 or 154 of the deep device isolation pattern 150 through a via plug 340. The via plug 340 may be connected to the semiconductor pattern 152 or 154 of the deep device isolation pattern 150 and may be connected to a corresponding one of the pixel electrodes 350 through the first insulating layer 312, the corresponding light-blocking pattern 314a, the third insulating layer 316, the corresponding low-refractive pattern 314b, and the fourth insulating layer 318. The semiconductor pattern 152 or 154 of the deep device isolation pattern 150 may be electrically connected to the second floating diffusion region FD2 through the corresponding contact plugs 220 and the corresponding conductive line 230.

The second insulating layer 322 may be interposed between the common electrode 356 and the micro lens array 330. The first to fourth insulating layers 312, 316, 318, and 322 and the electrode separation patterns 354 may be formed of or include at least one of, for example, silicon oxide, silicon nitride, and/or silicon oxynitride.

Except for the afore-described difference, the image sensor according to the present embodiments may be substantially the same as the image sensor described with reference to FIGS. 1 to 3 and 4A to 4C.

Figure 18:
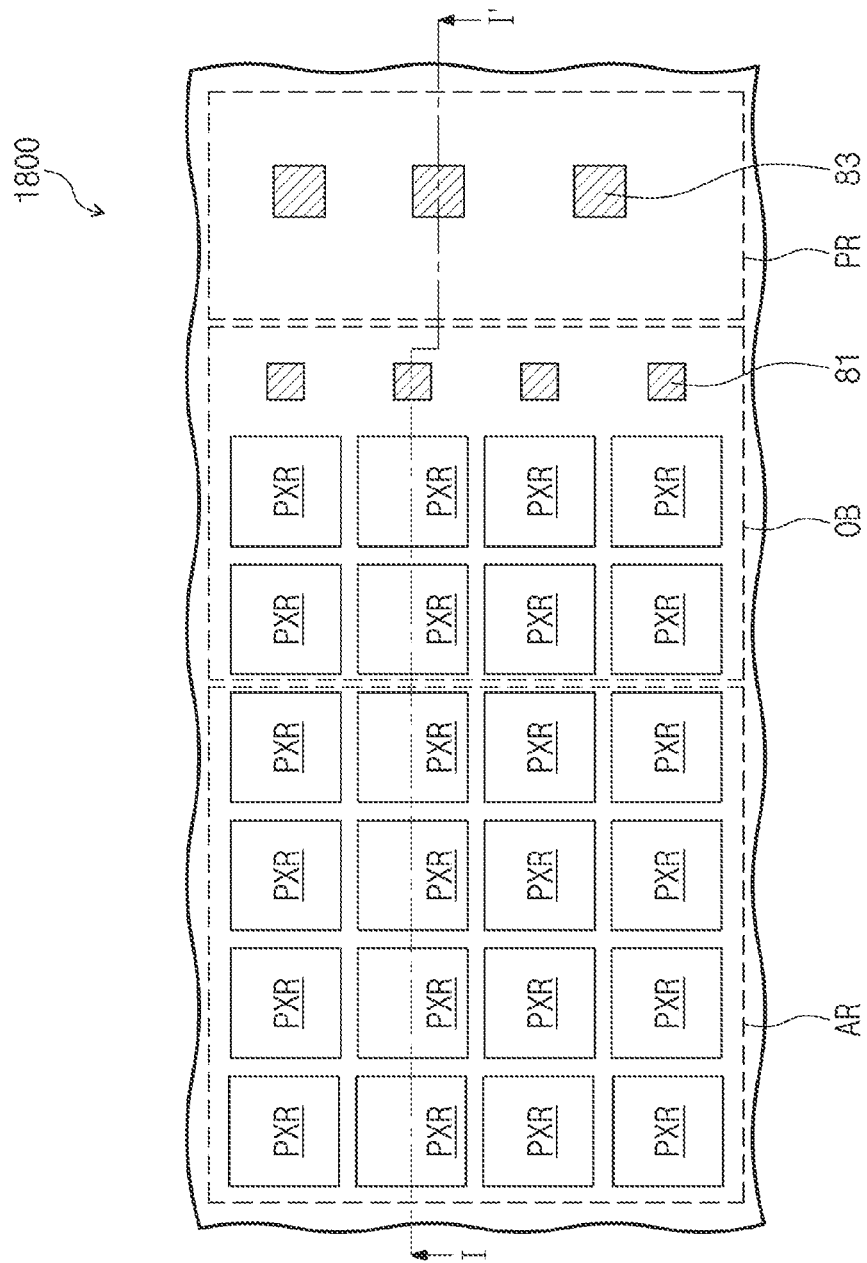
FIG. 18 is a plan view diagram illustrating an image sensor according to an embodiment of the present disclosure.
Figure 19:
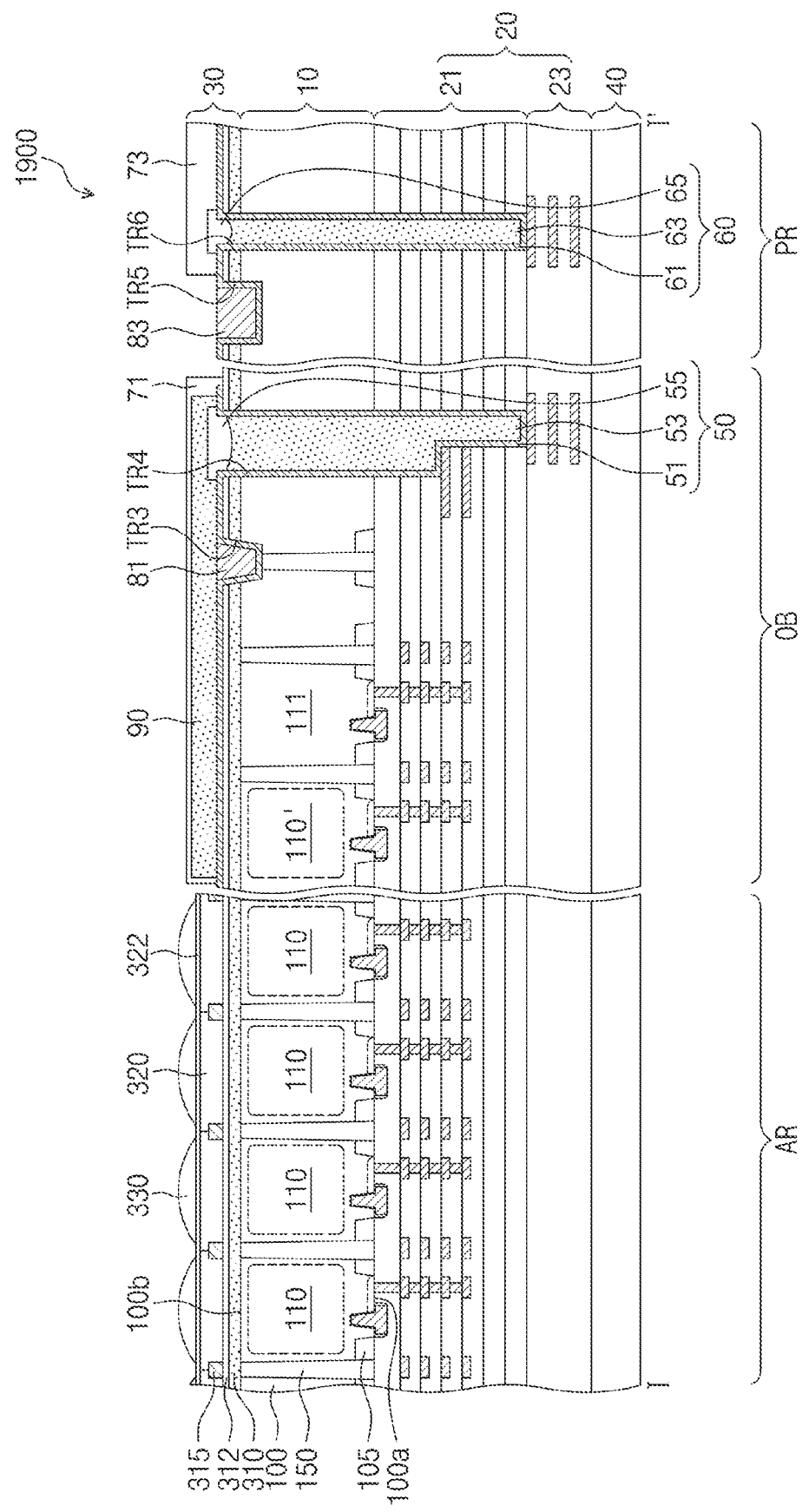
FIG. 19 is a sectional view diagram taken along a line I-I' of FIG. 18.

FIG. 18 shows a plan view illustrating an image sensor according to an embodiment of the present disclosure, and FIG. 19 shows a sectional view taken along a line I-I' of FIG. 18. For the sake of brevity, features which are different from those of the image sensor of FIGS. 1 to 3 and 4A to 4C will be mainly described below.

Referring to FIGS. 18 and 19, an image sensor 1800 may include the substrate 100, which includes a pixel array region AR, an optical black region OB, and a pad region PR, the interconnection layer 20, which is provided on the first surface 100a of the substrate 100, a base substrate 40, which is provided on the interconnection layer 20, and the optically-transparent layer 30, which is provided on the second surface 100b of the substrate 100, such as in section 1900. The interconnection layer 20 may be disposed between the first surface 100a of the substrate 100 and the base substrate 40. The interconnection layer 20 may include an upper interconnection layer 21, which is provided adjacent to the first surface 100a of the substrate 100, and a lower interconnection layer 23, which is provided between the upper interconnection layer 21 and the base substrate 40. The pixel array region AR may include a plurality of pixel regions PXR and a deep device isolation pattern 150 disposed therebetween. The pixel array region may be configured to have substantially the same features as that in the image sensor described with reference to FIGS. 1 to 17C.

A first connection structure 50, a first contact 81, and a bulk color filter 90 may be disposed on the optical black region OB of the substrate 100. The first connection structure 50 may include a first light-blocking pattern 51, a first isolation pattern 53, and a first capping pattern 55. The first light-blocking pattern 51 may be disposed on the second surface 100b of the substrate 100. The first light-blocking pattern 51 may cover the first insulating layer 312 and may conformally cover an inner surface of each of a third trench TR3 and a fourth trench TR4. The first light-blocking pattern 51 may be provided to penetrate the photoelectric conversion layer 10 and the upper interconnection layer 21. The first light-blocking pattern 51 may be connected to the semiconductor pattern 152 or 154 of the deep device isolation pattern 150 of the photoelectric conversion layer 10 and may be connected to interconnection lines in the upper and lower interconnection layers 21 and 23. Accordingly, the first connection structure 50 may electrically connect the photoelectric conversion layer 10 to the interconnection layer 20. The first light-blocking pattern 51 may be formed of or include at least one of metallic materials (e.g., tungsten). The first light-blocking pattern 51 may block light which is incident into the optical black region OB.

The first contact 81 may fill a remaining region of the third trench TR3. The first contact 81 may be formed of or include at least one of metallic materials (e.g., aluminum). The first contact 81 may be connected to the semiconductor pattern 152 or 154 of the deep device isolation pattern 150. A bias may be applied to the semiconductor pattern 152 or 154 through the first contact 81. The first isolation pattern 53 may fill a remaining region of the fourth trench TR4. The first isolation pattern 53 may penetrate the photoelectric conversion layer 10 and may penetrate a portion of the interconnection layer 20. The first isolation pattern 53 may be formed of or include at least one of insulating materials. The first capping pattern 55 may be disposed on the first isolation pattern 53. The first capping pattern 55 may be formed of or include the same material as the gap-fill insulating pattern 158 of the deep device isolation pattern 150.

The bulk color filter 90 may be disposed on the first connection structure 50 and the first contact 81. The bulk color filter 90 may cover the first connection structure 50 and the first contact 81. A first protection layer 71 may be disposed on the bulk color filter 90 to hermetically seal the bulk color filter 90.

An additional photoelectric conversion region 110' and a dummy region 111 may be provided in corresponding pixel regions PXR, which are provided in the optical black region OB. The additional photoelectric conversion region 110' may be a doped region, which is of a second conductivity type (e.g., n-type) different from the first conductivity type of the substrate 100. The additional photoelectric conversion region 110' may have a structure, which is similar to the photoelectric conversion regions 110 in the pixel regions PXR of the pixel array region AR, but may not execute the same function (i.e., of generating an electrical signal from an incident light) as the photoelectric conversion regions 110. The dummy region 111 may not be doped with impurities.

A second connection structure 60, a second contact 83, and a second protection layer 73 may be disposed on the pad region PR of the substrate 100. The second connection structure 60 may include a second light-blocking pattern 61, a second isolation pattern 63, and a second capping pattern 65.

The second light-blocking pattern 61 may be disposed on the second surface 100b of the substrate 100. The second light-blocking pattern 61 may cover the first insulating layer 312 and may conformally cover an inner surface of each of fifth and sixth trenches TR5 and TR6. The second light-blocking pattern 61 may be provided to penetrate the photoelectric conversion layer 10 and the upper interconnection layer 21. The second light-blocking pattern 61 may be connected to interconnection lines in the lower interconnection layer 23. Accordingly, the second connection structure 60 may electrically connect the photoelectric conversion layer 10 to the interconnection layer 20. The second light-blocking pattern 61 may be formed of or include at least one of metallic materials (e.g., tungsten). The second light-blocking pattern 61 may block light which is incident into the pad region PR.

The second contact 83 may fill a remaining region of the fifth trench TR5. The second contact 83 may be formed of or include at least one of metallic materials (e.g., aluminum). The second contact 83 may serve as an electric connection path between the image sensor and an external device. The second isolation pattern 63 may fill a remaining region of the sixth trench TR6. The second isolation pattern 63 may penetrate the photoelectric conversion layer 10 and may penetrate a portion of the interconnection layer 20. The second isolation pattern 63 may be formed of or include an insulating material. The second capping pattern 65 may be disposed on the second isolation pattern 63. The second capping pattern 65 may be formed of or include the same material as the gap-fill insulating pattern 158 of the deep device isolation pattern 150. The second protection layer 73 may cover the second connection structure 60.

A current, which is applied through the second contact 83, may be supplied to the semiconductor pattern 152 or 154 of the deep device isolation pattern 150 through the second light-blocking pattern 61, the interconnection lines in the interconnection layer 20, and the first light-blocking pattern 51. Electrical signals, which are generated from the photoelectric conversion regions 110 in the pixel regions PXR of the pixel array region AR, may be transmitted to the outside through the interconnection lines in the interconnection layer 20, the second light-blocking pattern 61, and the second contact 83.

According to an embodiment of the present disclosure, a deep device isolation pattern may include first portions, which are interposed between a first pixel region and a second pixel region and between a third pixel region and a fourth pixel region and are spaced apart from each other in a second direction, and second portions, which are interposed between the first pixel region and the third pixel region and between the second pixel region and the fourth pixel region and are spaced apart from each other in a first direction. The first to fourth pixel regions may be partially separated from each other by the first and second portions of the deep device isolation pattern, and thus, cross-talk between the first to fourth pixel regions can be minimized.

In addition, since the first portions of the deep device isolation pattern are spaced apart from each other in the second direction, a first extended active pattern, which is extended from the first pixel region to the second pixel region, and a second extended active pattern, which is extended from the third pixel region to the fourth pixel region, may be disposed between the first portions. Since each the first and second extended active patterns is extended to adjacent ones of the pixel regions, it may be possible to readily increase sizes of gate electrodes, which are disposed on each of the first and second extended active patterns.

Accordingly, in an image sensor according to an embodiment of the present disclosure, it may be possible to minimize cross-talk between adjacent ones of the pixels and to increase a size of a gate electrode, and this may make it possible to increase an integration density of the image sensor.

While illustrative embodiments based on the inventive concept have been particularly shown and described, it will be understood by those of ordinary skill in the pertinent art that variations in form and detail may be made therein without departing from the spirit and scope of the present disclosure as set forth in the following claims.

What is claimed is:
1. An image sensor, comprising:
a substrate including a plurality of pixel regions; and
a deep device isolation pattern disposed in the substrate between the pixel regions,
wherein the pixel regions comprise:
a first pixel region and a second pixel region, which are adjacent to each other in a first direction parallel to a first surface of the substrate;
a third pixel region, which is adjacent to the first pixel region in a second direction that is parallel to the first surface of the substrate and crosses the first direction; and
a fourth pixel region, which is adjacent to the second pixel region in the second direction and is adjacent to the third pixel region in the first direction,
wherein the deep device isolation pattern comprises:
first portions, which are interposed between the first and second pixel regions and between the third and fourth pixel regions and are spaced apart from each other in the second direction; and
second portions, which are interposed between the first and third pixel regions and between the second and fourth pixel regions and are spaced apart from each other in the first direction, wherein the first pixel region comprises a first extended active pattern, and wherein the first extended active pattern is extended to the second pixel region in the first direction and is disposed between the first portions of the deep device isolation pattern.

2. The image sensor of claim 1, wherein:
the third pixel region comprises a second extended active pattern, and
the second extended active pattern is extended to the fourth pixel region in the first direction and is disposed between the first portions of the deep device isolation pattern.

3. The image sensor of claim 2, wherein the second portions of the deep device isolation pattern are interposed between the first and second extended active patterns.

4. The image sensor of claim 3, further comprising a shallow device isolation pattern interposed between the first and second extended active patterns and between the second portions of the deep device isolation pattern.

5. The image sensor of claim 2, further comprising a shallow device isolation pattern interposed between the first portions of the deep device isolation pattern and between the first and second extended active patterns.

6. The image sensor of claim 1, further comprising a first extended gate electrode on the first extended active pattern,
wherein the first extended gate electrode is extended from the first pixel region to the second pixel region.

7. The image sensor of claim 1, wherein:
the first pixel region further comprises an active pattern spaced apart from the first extended active pattern, and
the image sensor further comprises a transfer gate electrode on the active pattern.

8. The image sensor of claim 7, wherein a lower portion of the transfer gate electrode is provided to penetrate the active pattern and is extended into the substrate.

9. The image sensor of claim 1, wherein:
the first extended active pattern is extended toward both sides of a corresponding first portion of the first portions of the deep device isolation pattern, and
the corresponding first portion is interposed between the first extended active pattern on the first pixel region and the first extended active pattern on the second pixel region.

10. The image sensor of claim 9, further comprising transfer gate electrodes, which are respectively disposed on the first extended active pattern on the first pixel region and the first extended active pattern on the second pixel region,
wherein a lower portion of each of the transfer gate electrodes is provided to penetrate the first extended active pattern and is extended into the substrate.

11. The image sensor of claim 9, further comprising a first extended gate electrode on the first extended active pattern,
wherein the first extended gate electrode is extended from the first pixel region to the second pixel region.

12. The image sensor of claim 1, wherein:
the substrate has a second surface which is disposed opposite to the first surface,
the first surface of the substrate exposes a top surface of the deep device isolation pattern, and the second surface of the substrate exposes a bottom surface of the deep device isolation pattern, and
the first extended active pattern is adjacent to the first surface.

13. The image sensor of claim 12, further comprising a shallow device isolation pattern adjacent to the first surface of the substrate, wherein the shallow device isolation pattern defines the first extended active pattern, and
wherein the deep device isolation pattern is provided to penetrate the shallow device isolation pattern and the substrate in a third direction perpendicular to the first surface of the substrate.

14. The image sensor of claim 13, wherein the deep device isolation pattern comprises:
a semiconductor pattern penetrating the substrate;
a gap-fill insulating pattern disposed on the semiconductor pattern to penetrate the shallow device isolation pattern; and
a sidewall insulating pattern between the substrate and the semiconductor pattern,
wherein the sidewall insulating pattern is extended to a region between the shallow device isolation pattern and the gap-fill insulating pattern.

15. The image sensor of claim 12, further comprising:
at least one gate electrode on the first extended active pattern; and
an interconnection layer disposed on the first surface of the substrate,
wherein the interconnection layer comprises contact plugs connected to the at least one gate electrode and conductive lines connected to the contact plugs.

16. The image sensor of claim 15, further comprising:
a micro lens array on the second surface of the substrate; and
a color filter array between the second surface of the substrate and the micro lens array.

17. The image sensor of claim 16, wherein:
the pixel regions are arranged in the substrate in the first and second directions,
the micro lens array comprises a plurality of micro lenses,
each of the micro lenses is disposed on two pixel regions, which are selected from the pixel regions and are adjacent to each other in the first direction, or on two pixel regions, which are selected from the pixel regions and are adjacent to each other in the second direction.

18. The image sensor of claim 16, wherein:
the micro lens array comprises a plurality of micro lenses, and
each of the micro lenses is disposed on the first to fourth pixel regions.

19. The image sensor of claim 16, wherein:
the pixel regions comprises a plurality of pixel groups, which are arranged in the first and second directions,
each of the pixel groups comprises the first to fourth pixel regions,
the micro lens array comprises a plurality of micro lenses,
each of the micro lenses is disposed on at least four pixel groups, which are selected from the pixel groups.

20. An image sensor, comprising:
a substrate having a first surface and a second surface, which are disposed opposite to each other; and
a deep device isolation pattern penetrating the substrate,
wherein the first surface of the substrate exposes a top surface of the deep device isolation pattern, and the second surface of the substrate exposes a bottom surface of the deep device isolation pattern,
wherein the substrate comprises:
a first pixel region and a second pixel region, which are adjacent to each other in a first direction parallel to the first surface;
a third pixel region, which is adjacent to the first pixel region in a second direction that is parallel to the first surface and crosses the first direction; and a fourth pixel region, which is adjacent to the second pixel region in the second direction and is adjacent to the third pixel region in the first direction, wherein the deep device isolation pattern comprises:

first portions, which are interposed between the first and second pixel regions and between the third and fourth pixel regions and are spaced apart from each other in the second direction; and second portions, which are interposed between the first and third pixel regions and between the second and fourth pixel regions and are spaced apart from each other in the first direction.

* * * * *